(12) United States Patent  (10) Patent No.: US 8,193,033 B2
Kurita                    (45) Date of Patent:     Jun. 5, 2012

(54) SEMICONDUCTOR DEVICE HAVING A SEALING RESIN AND METHOD OF MANUFACTURING THE SAME

(75) Inventor: Yoichiro Kurita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 164 days.

(21) Appl. No.: 12/169,930

(22) Filed: Jul. 9, 2008

(65) Prior Publication Data

US 2008/0265434 A1    Oct. 30, 2008

Related U.S. Application Data

(62) Division of application No. 11/159,157, filed on Jun. 23, 2005, now Pat. No. 7,795,721.

(30) Foreign Application Priority Data

Jun. 30, 2004 (JP) ................................. 2004-194690

(51) Int. Cl.
    *H01L 21/00* (2006.01)
(52) U.S. Cl. ........ 438/108; 438/106; 438/107; 438/109; 438/125; 438/126
(58) Field of Classification Search .......... 438/106–109, 438/125–126
    See application file for complete search history.

(56) References Cited

U.S. PATENT DOCUMENTS

| | | | |
|---|---|---|---|
| 6,137,164 A | 10/2000 | Yew et al. | |
| 6,194,668 B1 | 2/2001 | Horiuchi et al. | |
| 6,274,937 B1 | 8/2001 | Ahn et al. | |
| 6,281,042 B1 | 8/2001 | Ahn et al. | |
| 6,424,034 B1 | 7/2002 | Ahn et al. | |
| 6,489,687 B1 * | 12/2002 | Hashimoto | 257/777 |
| 6,671,947 B2 | 1/2004 | Bohr | |
| 6,673,653 B2 | 1/2004 | Pierce | |
| 6,693,362 B2 | 2/2004 | Seyama et al. | |
| 6,833,285 B1 | 12/2004 | Ahn et al. | |
| 6,841,869 B1 * | 1/2005 | Triantafyllou et al. | 257/723 |

(Continued)

FOREIGN PATENT DOCUMENTS

JP    03-120749    5/1991

(Continued)

OTHER PUBLICATIONS

Japanese Patent Office issued a Japanese Office Action dated Feb. 2, 2010, Application No. 2004-194690.

(Continued)

*Primary Examiner* — Bac Au
(74) *Attorney, Agent, or Firm* — Young & Thompson

(57) ABSTRACT

The semiconductor device 100 comprises a first semiconductor element 113 provided on a face on one side of a flat plate shaped interconnect component 101, an insulating resin 119 covering a face of a side where the first semiconductor element 113 of the interconnect component 101 is provided and a side face of the first semiconductor element 113, and a second semiconductor element 111 provided on a face on the other side of the interconnect component 101. The interconnect component 101 has a constitution where an interconnect layer 103, a silicon layer 105 and an insulating film 107 are sequentially formed. The interconnect layer 103 has a constitution where the interconnect layer 103 has a flat plate shaped insulating component and a conductive component extending through the insulating component. The first semiconductor element 113 is electrically connected with the second semiconductor element 111 through the conductive component.

19 Claims, 28 Drawing Sheets

U.S. PATENT DOCUMENTS

| | | |
|---|---|---|
| 6,897,544 B2 | 5/2005 | Ooi et al. |
| 7,235,477 B2 | 6/2007 | Ogawa |
| 7,473,992 B2 | 1/2009 | Ogawa |
| 2002/0030261 A1 | 3/2002 | Rolda et al. |
| 2004/0021210 A1* | 2/2004 | Hosomi .................. 257/686 |
| 2004/0056344 A1* | 3/2004 | Ogawa et al. ............ 257/686 |
| 2004/0084771 A1 | 5/2004 | Bolken et al. |
| 2004/0155358 A1* | 8/2004 | Iijima .................... 257/778 |
| 2004/0224499 A1* | 11/2004 | Yoneda et al. ........... 438/640 |
| 2004/0229398 A1* | 11/2004 | Magerlein et al. ........ 438/106 |
| 2005/0035464 A1* | 2/2005 | Ho et al. ................ 257/778 |
| 2005/0056942 A1* | 3/2005 | Pogge et al. ............ 257/778 |
| 2005/0136634 A1 | 6/2005 | Savastiouk et al. |
| 2006/0151870 A1* | 7/2006 | Nishiyama et al. ........ 257/700 |

FOREIGN PATENT DOCUMENTS

| | | |
|---|---|---|
| JP | 04-370958 | 12/1992 |
| JP | 05-048001 | 2/1993 |
| JP | 11-186332 | 7/1999 |
| JP | 11-312712 | 11/1999 |
| JP | 2001-177049 | 6/2001 |
| JP | 2001-345418 | 12/2001 |
| JP | 2002-164467 | 6/2002 |
| JP | 2002-314031 | 10/2002 |
| JP | 2002-343904 | 11/2002 |
| JP | 2003-007910 | 1/2003 |
| JP | 2003-046026 | 2/2003 |
| JP | 2003-273317 | 9/2003 |
| JP | 2004-039867 | 2/2004 |
| JP | 2004-079756 | 3/2004 |
| JP | 2004-152883 | 5/2004 |
| WO | 02/069399 | 9/2002 |

OTHER PUBLICATIONS

Official Action issued Sep. 20, 2011 by the Japanese Patent Office in corresponding Japanese Patent Application No. 2004-194690 with partial English translation.

Official Action issued Oct. 18, 2011 by the Japanese Patent Office in corresponding Japanese Patent Application No. 2009-114222 with partial English translation.

Official Action issued Oct. 18, 2011 by the Japanese Patent Office in corresponding Japanese Patent Application No. 2009-298355 with partial English translation.

* cited by examiner

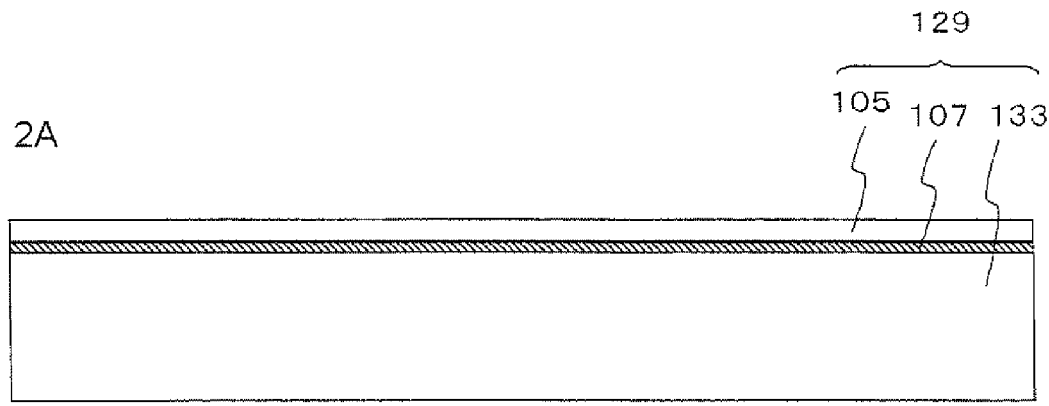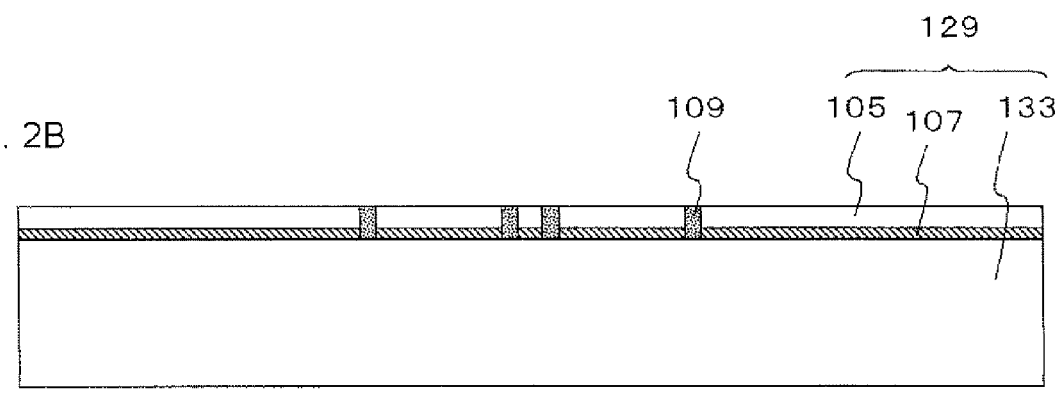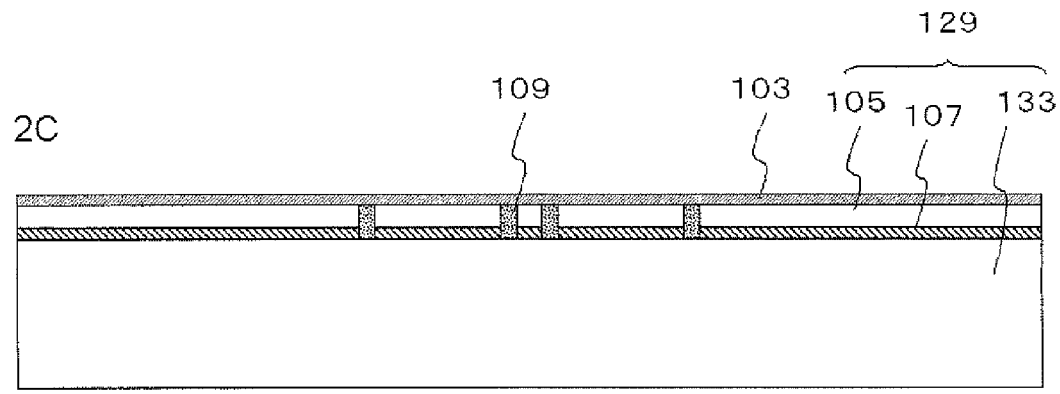

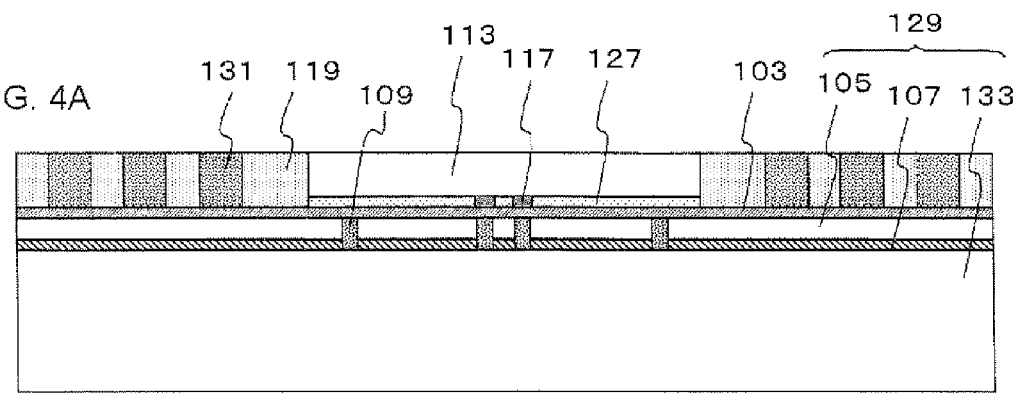
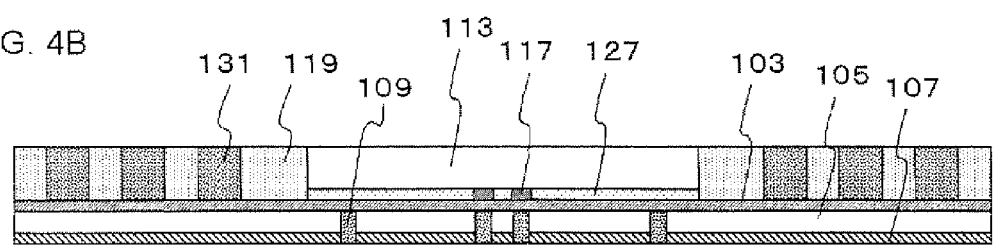
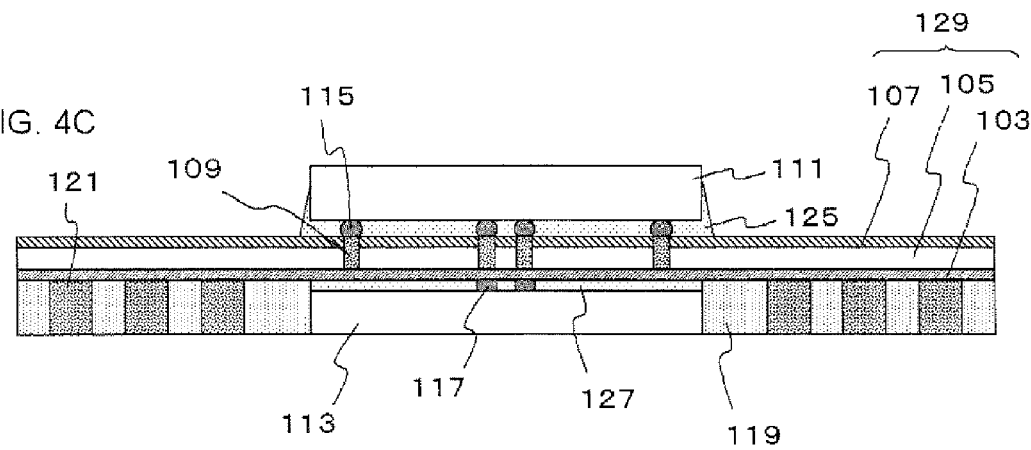

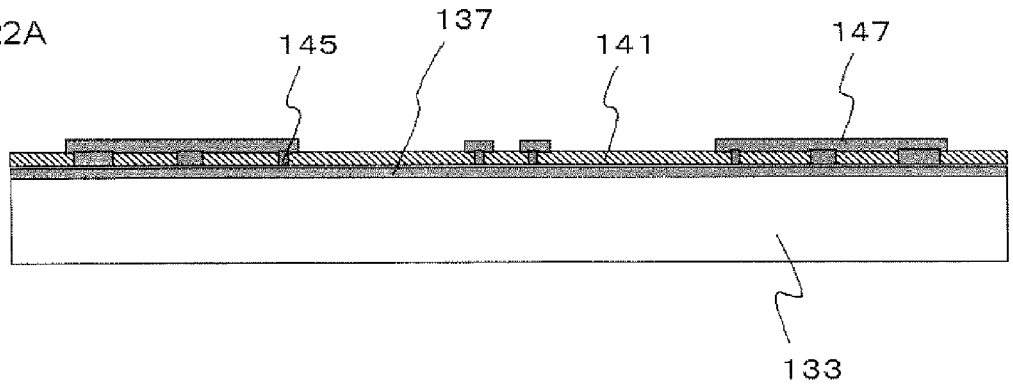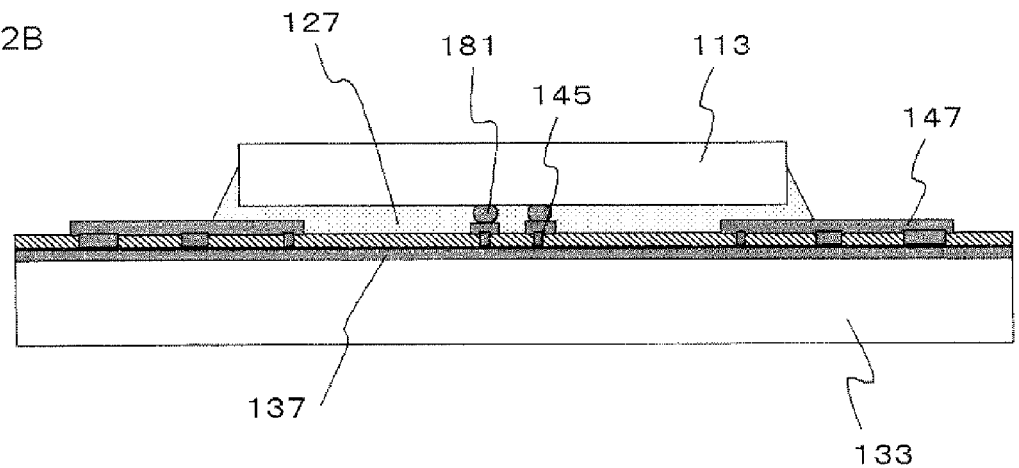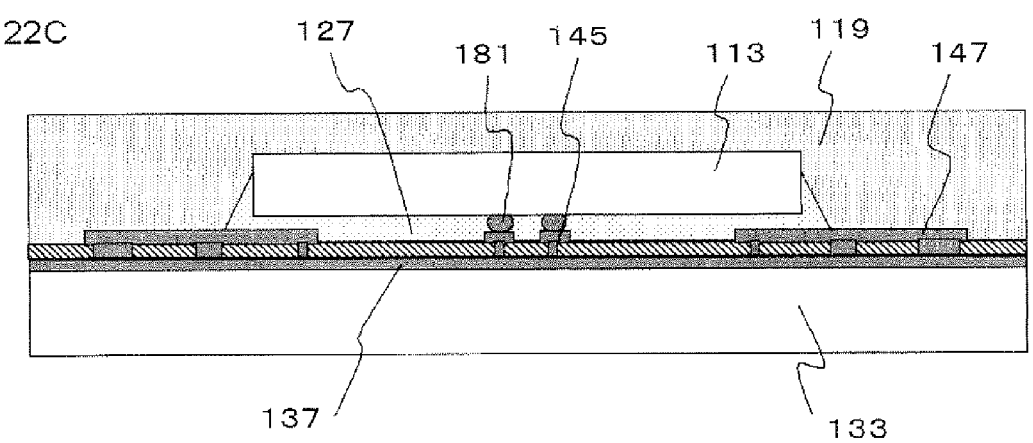

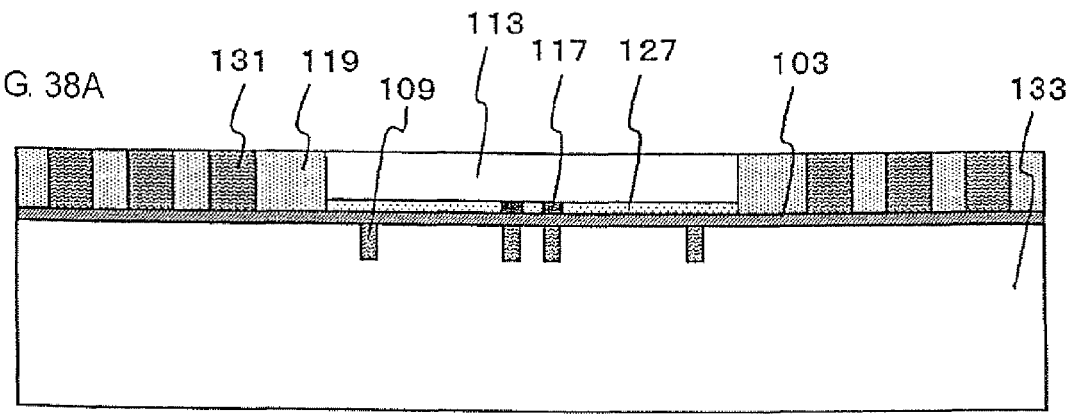
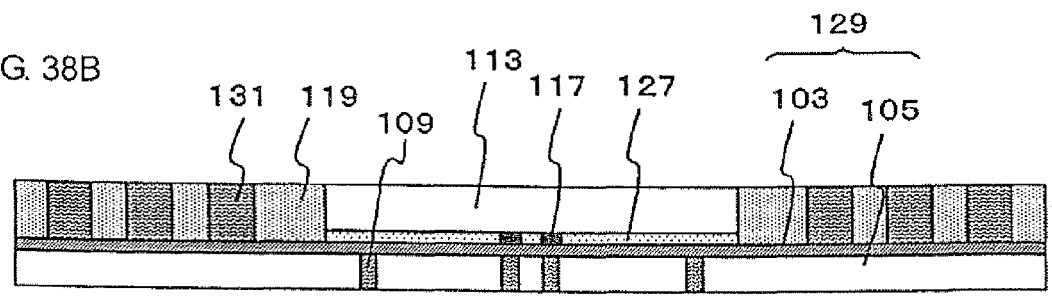
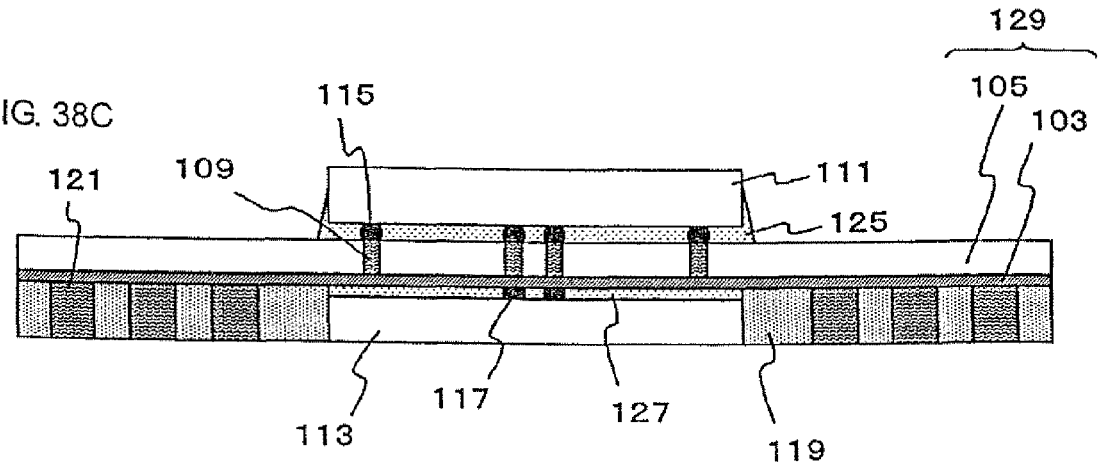

SEMICONDUCTOR DEVICE HAVING A SEALING RESIN AND METHOD OF MANUFACTURING THE SAME

This application is based on Japanese patent application NO. 2004-194690, the content of which is incorporated hereinto by reference.

BACKGROUND OF THE INVENTION

1. Field of the Invention

The present invention relates to a semiconductor device and a method for manufacturing the same.

2. Related Art

As for a conventional semiconductor device, the Japanese Laid-Open Patent Publication No. 2001-345418 discloses the conventional semiconductor device. The Japanese Laid-Open Patent Publication No. 2001-345418 discloses a both-side mounting structure component in which the semiconductor device is provided on both faces of a circuit board using a flip chip mounting. According to the Japanese Laid-Open Patent Publication No. 2001-345418, improvement of a manufacturing yield and reliability may be made possible upon adjusting a glass transition temperature of a sealing resin sealing the semiconductor device after mounting.

SUMMARY OF THE INVENTION

However, it has now been discovered that, in the conventional technique described in the Japanese Laid-Open Patent Publication No. 2001-345418, there is fear that bonding accuracy or quality deteriorates caused by difference of a thermal expansion coefficient between the substrate and base material of the semiconductor element. For this reason, the connection of a fine interconnect to the semiconductor element is difficult. Furthermore, also there is room for improvement in connecting reliability. Therefore, it is difficult to realize a large-scale inter-chip connection with high interconnect density.

According to the present invention, there is provided a semiconductor device comprising an interconnect component in a shape of a flat plate, a first semiconductor element provided on a face on one side of the interconnect component, a sealing resin covering the face on one side and a side face of the first semiconductor element, and a second semiconductor element provided on a face on the other side of the interconnect component, wherein the interconnect component is provided with an interconnect layer, a support layer supporting the interconnect layer, and a through electrode, which extends through the support layer, connecting with the interconnect layer; and wherein the first semiconductor element is electrically connected with the second semiconductor element through the interconnect component.

The semiconductor device of the present invention is provided with the interconnect layer, the support layer supporting the interconnect layer, and the through electrode, which extends through the support layer, connects with the interconnect layer; therefore, in the semiconductor device, it is possible to arrange the through electrode with high density. Further, since the semiconductor device has a support layer, it is possible to enhance connecting reliability between the semiconductor element and the through electrode when providing the through electrode with high density. Consequently, it is possible to realize connection of a plurality of chips or large scale inter-chip connection.

In the present invention, the semiconductor device may have a configuration in which the interconnect layer and the support layer are sequentially formed. Further, the semiconductor device may have a configuration in which the through electrode is constituted of a plurality of conductive components.

In the semiconductor device of the present invention, a linear expansion coefficient of the material of the support layer may not be less than 0.5 ppm/degree C. to not more than 5 ppm/degree C. Having such configuration, it is possible to further enhance connecting reliability between the first semiconductor element and the second semiconductor element.

In the semiconductor device of the present invention, the support layer may be a silicon layer. A fine interconnect component is formed on the silicon layer with high rigidity, followed by connecting the support layer with the silicon semiconductor element having the same thermal expansion coefficient as the support layer, so that connection with high accuracy and high reliability can be presented.

In the semiconductor device of the present invention, an active element such as a transistor or the like may be formed in the support layer.

In the semiconductor device of the present invention, the interconnect component may have a configuration in which an insulating film, the support layer and the interconnect layer are sequentially formed; and the first semiconductor element may be connected with the interconnect layer, and the second semiconductor element may be connected with the insulating film. Having such configuration, it is possible to insulate surely a face of the semiconductor element, and it is possible to sufficiently secure connecting reliability of mutual semiconductor elements. In the present invention, the semiconductor device may have a configuration in which mutual semiconductor elements are electrically connected with each other through the through electrode extending through the silicon layer and the insulating film, and the interconnect layer.

According to the present invention, there is provided a semiconductor device comprising an interconnect component in a shape of flat plate, a first semiconductor element provided on a face on one side of the interconnect component, a sealing resin covering the face on one side and a side face of the first semiconductor element, and a second semiconductor element provided on a face on the other side of the interconnect component, wherein the interconnect component is provided with an interconnect layer having a flat plate shaped insulating component, and a conductive component extending through the insulating component, and the first semiconductor element is electrically connected with the second semiconductor element through the conductive component.

In the semiconductor device of the present invention, the conductive component extends through a flat plate shaped insulating component. For this reason, it is possible to realize the narrowing of the intervals of the conductive component. Consequently, it is possible to arrange the conductive component, which connects the first semiconductor element with the second semiconductor element, with high density.

In the present invention, the conductive component extending through the insulating component may be constituted of a continuous one component, or may be configuration in which a plurality of conductive components are bonded so that electrical connection is secured. For instance, one conductive component may be configuration composed of one conductive plug. Further, the semiconductor device may have a configuration in which the interconnect layer is a multi-layered interconnect, and the conductive component is connected with the interconnect and a plug inside the interconnect layer.

In the semiconductor device of the present invention, the semiconductor device may have a configuration in which the conductive component includes a connection electrode provided on a face in either of the insulating component, the side face of the connection electrode is embedded inside the insulating component, and the whole of at least one face of the connection electrode is exposed from the insulating component. In this configuration, since the whole of at least one face of the connection electrode is exposed from the insulating component, an external lead-out electrode does not come into contact with the insulating component. Therefore, it is possible to accurately provide the connection electrode with high density.

It should be noted that, in the present invention, the semiconductor device may have a configuration in which a side face of the connection electrode comes into contact with the insulating component. Further, the whole of a side face outer periphery of the connection electrode may come into contact with the insulating component. Furthermore, in the present invention, a face of the interconnect component of a side provided with the connection electrode may be a flat face.

Moreover, in the present invention, the connection electrode includes an element connection electrode electrically connecting with the semiconductor element and an external connection electrode connecting with the conductive component outside the element. In the present invention, it is possible to realize the above described configuration in either of them.

In the semiconductor device of the present invention, the semiconductor device may have a configuration in which the conductive component includes an interconnect provided in such a way as to come into contact with a face in either of the insulating component; and at least a part of a side face of the interconnect and one face of the interconnect are exposed from the insulating component. Therefore, it is possible to realize a configuration in which the fine interconnect is capable of being provided with high density.

It should be noted that, in the semiconductor device of the present invention, the semiconductor device may have a configuration in which the interconnect is electrically connected with the lead-out electrode. Further, in the present invention, the whole side face of the interconnect may be exposed from the insulating component.

In the semiconductor device of the present invention, at least a part of the interconnect may be embedded in the sealing resin. Therefore, it is possible to enhance strength of the semiconductor device.

In the semiconductor device of the present invention, a minimum interval between the conductive components may not be more than 50 μm. Therefore, it is possible to enhance a data transfer characteristics between the semiconductor elements.

In the semiconductor device of the present invention, the conductive component may be employing various kinds of planar arrangement. For instance, arrangement such as a tetragonal lattice shape, or a diagonal lattice shape such as a staggered lattice shape or the like may be employed.

In the semiconductor device of the present invention, the semiconductor device may have a configuration in which the position of the first conductive pad provided at a side of the interconnect component of the first semiconductor element is the same as the position of the second conductive pad provided on a face of a side of the interconnect component of the second semiconductor element in a plan view. Therefore, it is possible to further enhance the data transfer characteristics between the semiconductor elements.

In the semiconductor device of the present invention, the semiconductor device may have a configuration in which having a through plug extending through a sealing resin is provided. Having such configuration, it is possible to obtain excellent secondary mounting reliability due to a thermal stress reducing function. Further, the semiconductor device may have a configuration in which the whole semiconductor device to be a compound element is bonded to a flip chip connection. It should be noted that, in the semiconductor device of the present invention, the semiconductor device may have a configuration in which a through plug is connected with the interconnect inside the interconnect layer.

In the semiconductor device of the present invention, the interconnect layer may be a multi-layered interconnect layer. Therefore, it is possible to enhance the degree of freedom in designing of the interconnect component.

In the semiconductor device of the present invention, the first semiconductor element may be embedded in a sealing resin. Therefore, it is possible to insulate a face of the first semiconductor element surely, and it is possible to protect the first semiconductor element.

According to the present invention, there is provided a method for manufacturing a semiconductor device comprising: preparing an interconnect layer on a substrate, connecting a first semiconductor element on the interconnect layer, covering a face of the interconnect layer and a side face of the first semiconductor element with a sealing resin, thinning the substrate from a back face of a forming face of the interconnect layer of the substrate, and connecting the second semiconductor element with the first semiconductor element through the interconnect layer so as to cause the second semiconductor element to face to the first semiconductor element.

Further, in the semiconductor device of the present invention, the semiconductor device may have a configuration in which the semiconductor device is obtained in such a way that the interconnect component is formed on the substrate, the first semiconductor element is connected on the interconnect component, and the substrate is removed after a side face of the first semiconductor element and the exposed face of the interconnect component are covered with the sealing resin.

In the present invention, the first semiconductor element is connected with the interconnect component in a state where the interconnect component is provided on the substrate, after that, the substrate is thinned or removed. For this reason, it is possible to perform connecting between the first semiconductor element and the interconnect component. It should be noted that, in the present invention, "something is provided on the semiconductor substrate" may be in either of constitution in which "something is provided in such a way as to come into contact with the semiconductor substrate", or, constitution in which "something is provided through the other layer".

In the semiconductor device of the present invention, a linear expansion coefficient of the substrate may not be less than 0.5 ppm/degree C. to not more than 5 ppm/degree C. Therefore, it is possible to realize a configuration more excellent in manufacturing stability.

In the semiconductor device of the present invention, the substrate may be a silicon substrate. Therefore, it is possible to realize a configuration more excellent in manufacturing stability.

Further, in the method manufacturing the semiconductor device of the present invention, the substrate used for preparing the interconnect layer, the semiconductor substrate constituting the first semiconductor element, and the semiconductor substrate constituting the second semiconductor element may be formed with the same material. Therefore, it is possible to surely suppress warpage at the time the substrate is connected with the elements. For this season, it is possible to enhance connecting reliability.

Further, in the method for manufacturing the semiconductor device of the present invention, the thinning the substrate may include removing the substrate to expose a face of the interconnect layer. Having such process, it is possible to stably manufacture the semiconductor device while simplifying the configuration of the semiconductor device.

In the method for manufacturing the semiconductor device of the present invention, the preparing the interconnect layer may include preparing the substrate in which an insulating film and a support layer supporting the interconnect layer are sequentially formed on a face of the substrate, and providing the interconnect layer on the support layer. Having such process, it is possible to further enhance the connecting reliability between the interconnect layer and the semiconductor element.

According to the present invention, a technique for connecting among a plurality of semiconductor elements with high density can be realized. Further, according to the present invention, a technique enhancing the connecting reliability among the plurality of the semiconductor elements can be realized.

BRIEF DESCRIPTION OF THE DRAWINGS

The above and other objects, advantages and features of the present invention will be more apparent from the following description taken in conjunction with the accompanying drawings, in which:

FIGS. 2A, 2B and 2C are cross-sectional process views schematically showing a manufacturing process of the semiconductor device according to the embodiment;

FIGS. 4A, 4B and 4C are cross-sectional process views schematically showing a manufacturing process of the semiconductor device according to the embodiment;

FIGS. 22A, 22B and 22C are cross-sectional process views schematically showing a manufacturing process of the semiconductor device according to the embodiment;

FIGS. 38A, 38B and 38C are cross-sectional process views schematically showing a manufacturing process of the semiconductor device according to the embodiment.

DETAILED DESCRIPTION OF THE INVENTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described embodiments of the present invention using drawings. It should be noted that, in the whole drawings, common symbols are attached to the same constitution elements not to present explanation appropriately.

Figure 7:
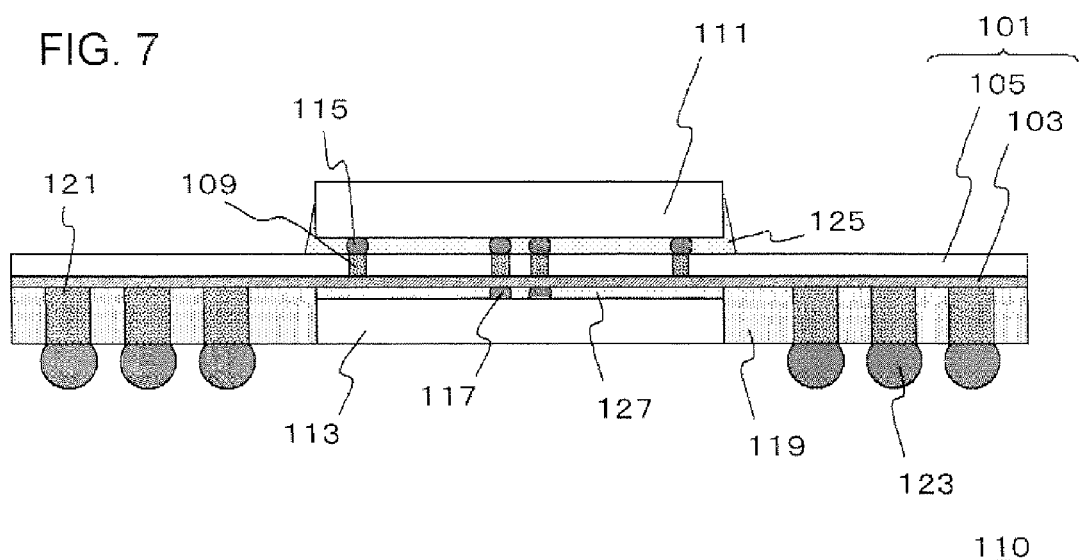
FIG. 7 is a cross-sectional view schematically showing the configuration of the semiconductor device according to the embodiment.

A semiconductor device 110 shown in FIG. 7 comprises an interconnect component 101 in a shape of a flat plate, a first semiconductor element 113 provided on a face on one side of the interconnect component 101, a sealing resin (insulating resin 119) covering the face on one side and a side face of the first semiconductor element 113, and a second semiconductor element 111 provided on a face on the other side of the interconnect component 101. The interconnect component 101 is provided with an interconnect layer 103, a support layer (silicon layer 105) supporting the interconnect layer 103, and a through electrode (conductive via 109) which extends through the interconnect layer 103 and the support layer. The first semiconductor element 113 is electrically connected with the second semiconductor element 111 through the interconnect component 101.

Figure 1:
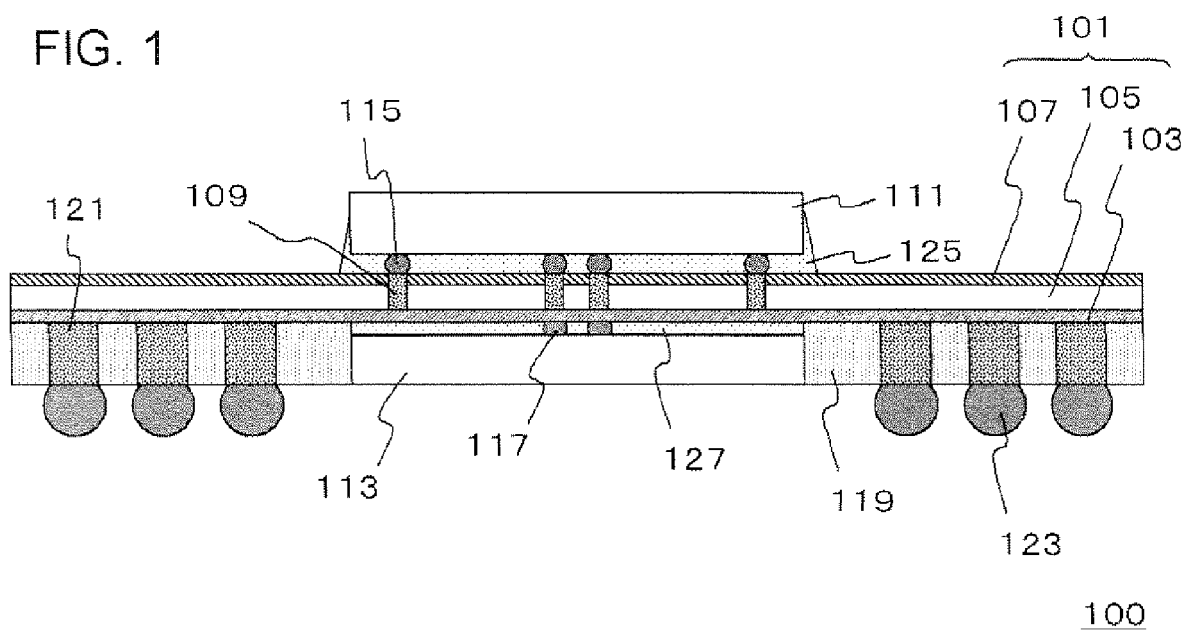
FIG. 1 is a cross-sectional view schematically showing configuration of a semiconductor device according to an embodiment.

A semiconductor device 100 shown in FIG. 1 comprises the interconnect component 101 in a shape of flat plate, the first semiconductor element 113 provided on a face on one side of the interconnect component 101, a sealing resin (insulating resin 119) covering the face on one side and a side face of the first semiconductor element 113, and a second semiconductor element 111 provided on a face on the other side of the interconnect component 101. The interconnect component 101 is provided with an interconnect layer 103 having a flat plate shaped insulating component (insulating resin film 141 (FIG. 32)), and a conductive component (conductive via 109) extending through the insulating component. The first semiconductor element 113 is electrically connected with the second semiconductor element 111 through the conductive component.

A method for manufacturing the semiconductor device 100 shown in FIGS. 2A to 4C comprises preparing an interconnect layer 103 on a substrate (an SOI substrate 129), connecting a first semiconductor element 113 on the interconnect layer 103, covering a face of the interconnect layer 103 and a side face of the first semiconductor element 113 with a sealing resin (insulating resin 119), thinning the substrate from the back face of the forming face of the interconnect layer 103 of the substrate, and a step of connecting the second semiconductor element 111 with the first semiconductor element 113 through the interconnect layer 103 so as to cause the second semiconductor element 111 to face to the first semiconductor element 113.

(First Embodiment)

FIG. 1 is a cross-sectional view schematically showing a structure of the semiconductor device 100 according to the present embodiment. The semiconductor device 100 shown in FIG. 1 has the interconnect component 101 in the shape of a flat plate, the first semiconductor element 113 provided on a face on one side of the interconnect component 101, the insulating resin 119, which coats the face on one side where the first semiconductor element 113 of the interconnect component 101 is provided and a side face of the first semiconductor element 113, and the second semiconductor element 111 provided in such a way as to cause the second semiconductor element 111 to face to the first semiconductor element 113 on a face on the other side of the interconnect component 101.

The interconnect component 101 has a configuration where the interconnect layer 103, a silicon layer 105 and an insulating film 107 are sequentially formed into a multilayered structure. The first semiconductor element 113 is provided at a side of the interconnect layer 103, and the second semiconductor element 111 is provided at a side of the insulating film 107.

The interconnect layer 103 has a flat plate shaped insulating component and a conductive component extending through (penetrating) the insulating component. The second semiconductor element 111 is electrically connected with the first semiconductor element 113 through the conductive component. Further, the interconnect layer 103 is provided with an interconnect having predetermined shape and arrangement. The interconnect layer 103 may be a single layer, or a multilayer. It should be noted that specific structure of the interconnect layer 103 may be realized by the later described structure described in the third embodiment and the seventh embodiment.

The silicon layer 105 is a support layer supporting the interconnect layer 103. An insulating film 107, which is provided on a face of the silicon layer 105, on opposite side to the interconnect layer 103 is made of, for instance, an oxide film such as $SiO_2$ or the like, or a nitride film such as SiN or SiON or the like.

It should be noted that, as for the support layer of the interconnect layer 103, in the present embodiment and later embodiments, the silicon layer 105 is exemplified. However, as for the support layer of the interconnect layer 103, there may be employed another material having a coefficient of thermal expansion approximately the same degree as Si, which is generally used as a substrate of the first semiconductor element 113 and the second semiconductor element 111.

It is possible to use materials whose linear expansion coefficient is not less than 0.5 ppm/degree C. to not more than 5 ppm/degree C. as the support layer. It is possible to enhance a manufacturing yield of the semiconductor device 100 upon making the linear expansion coefficient to be not less than 0.5 ppm/degree C. Furthermore, electrical connecting reliability between the first semiconductor element 113 and the second semiconductor element 111 is capable of being secured sufficiently upon making the linear expansion coefficient to be not more than 5 ppm/degree C. Moreover, the support layer is capable of being constituted of the material excellent in thermal conductivity. It is possible to employ, specifically, ceramic materials such as AlN or the like, borosilicate glass or the like such as Pyrex™ glass or the like as materials of the support layer in addition to silicon.

Furthermore, the interconnect layer 103 has a conductive via 109 provided while extending through (penetrating) the silicon layer 105 and the insulating film 107. Thereby, electric conduction of both faces of the interconnect layer 103 is secured. There is no limitation especially on the planar arrangement of the conductive via 109. It is possible to appropriately select the planar arrangement of the conductive via 109 in accordance with a design of the semiconductor device 100. For instance, the conductive via 109 can be arranged in a tetragonal lattice shape, or the conductive via 109 can be arranged in a diagonal lattice shape such as staggered lattice shape or the like.

The first semiconductor element 113 is bonded to a side of the interconnect layer 103 of the interconnect component 101 through an underfill resin 127. A conductive component (not shown in the drawings) inside the first semiconductor element 113 is flip chip-connected with the conductive via 109 through an electrode 117 embedded inside the underfill resin 127. Furthermore, in the interconnect component 101, there is provided the insulating resin 119 covering a side wall of the first semiconductor element 113 on a face of a side where the first semiconductor element 113 is provided.

Constitution of the first semiconductor 113 and the second semiconductor 111 is capable of being selected appropriately according to a design of the semiconductor device 100. For instance, it is possible to employ a memory LSI chip as the first semiconductor element 113, and to employ a logic LSI chip as the second semiconductor element 111.

There is no limitation especially on the material of the insulating resin 119 to be a sealing resin. It is possible to use a resin for sealing the semiconductor with appropriately selected. For instance, it is possible to employ an epoxy resin including an inorganic filling material such as silica, alumina or the like.

A conductive plug 121 extends through (penetrates) the insulating resin 119, and is electrically connected with a conductive component inside the interconnect component 101. A face of the conductive plug 121 on opposite side to the interconnect component 101 is exposed from the insulating resin 119. An electrode terminal 123 is provided on an exposed face. The conductive plug 121 is electrically connected with the outside through the electrode terminal 123.

The second semiconductor element 111 is bonded to a side of the insulating film 107 of the interconnect component 101 through an underfill resin 125. A conductive component (not shown in the drawings) inside the second semiconductor element 111 is flip-chip connected with the conductive via 109 through an electrode 115 embedded inside the underfill resin 125.

In the semiconductor device 100, the first semiconductor element 113 and the second semiconductor element 111 have a constitution where the first semiconductor element 113 is electrically connected with the second semiconductor element 111 through the electrode 117, the conductive component inside the interconnect layer 103, the conductive via 109 and the electrode 115. It should be noted that, in the present embodiment and other later embodiments, it is possible to employ, for instance, the electrode 115 and the electrode 117 as bump.

Hereinafter, there will be explained a method for manufacturing the semiconductor 100 shown in FIG. 1. The semiconductor device 100 is obtained in such a way that the interconnect layer 103 is formed on the silicon substrate, the first semiconductor element 113 is connected on the interconnect layer 103, and the silicon substrate is removed after side face of the first semiconductor element 113 and the exposed face of the first semiconductor element 113 are resin-sealed. FIGS. 2A to 2C, FIGS. 3A to 3C, and FIGS. 4A to 4C are cross-sectional process views showing manufacturing process of the semiconductor device 100.

Firstly, as shown in FIG. 2A, an SOI (silicon on insulator) substrate 129 where the silicon layer 105 is formed on an upper part of the silicon substrate 133 in wafer state through the insulating film 107 is prepared. The insulating film 107 may be a single layer, or may be a multilayer.

Next, an opening extending through (penetrating) the silicon layer 105 and the insulating film 107 is formed at the position where the conductive via 109 is provided on the SOI substrate 129. And then, a diffusion barrier is formed on a face of the SOI substrate 129 on which the opening is provided. Thereby, it is possible to prevent the material constituting the conductive via 109 from diffusing into the SOI substrate 129. And then, the conductive via 109 is formed upon embedding the opening with conductive material (FIG. 2B). The conductive via 109 is capable of being provided on a region where the second semiconductor element 111 and the first semiconductor element 113 are bonded in the SOI substrate 129.

As for the material of the conductive via 109, it is possible to use, for instance, metals such as copper, aluminum, or tungsten or the like, or polycrystalline silicon or the like. It should be noted that it may be also suitable to employ a constitution where the conductive via 109 does not penetrate the insulating film 107, but the conductive via 109 is provided across a predetermined position inside the insulating film 107 from the silicon layer 105. Furthermore, it may be also suitable to employ a constitution where the conductive via 109 penetrates the silicon layer 105 and comes into contact with an upper part of the insulating film 107.

Next, the interconnect layer 103 is formed on an upper part of the SOI substrate 129 (FIG. 2C). A method for manufacturing the interconnect layer 103 is capable of employing a method, which is later described in the third embodiment and the seventh embodiment. Moreover, it may be suitable that the insulating film is formed on the silicon layer 105; and an interconnect with predetermined shape is arranged on a predetermined position using, for instance, a damascene process. The interconnect is electrically connected with the conductive via 109. It is suitable that the material of the interconnect is made the same material as the material of the conductive via 109, or, also it is possible to employ different conductive material. The interconnect layer 103 may be a single-layer structure, or a multi-layered structure. Furthermore, before forming the interconnect layer 103, it may be also suitable to form predetermined element, for instance, an active element such as a transistor or the like, or a passive element such as a memory element or the like on the silicon layer 105.

Figure 3A:
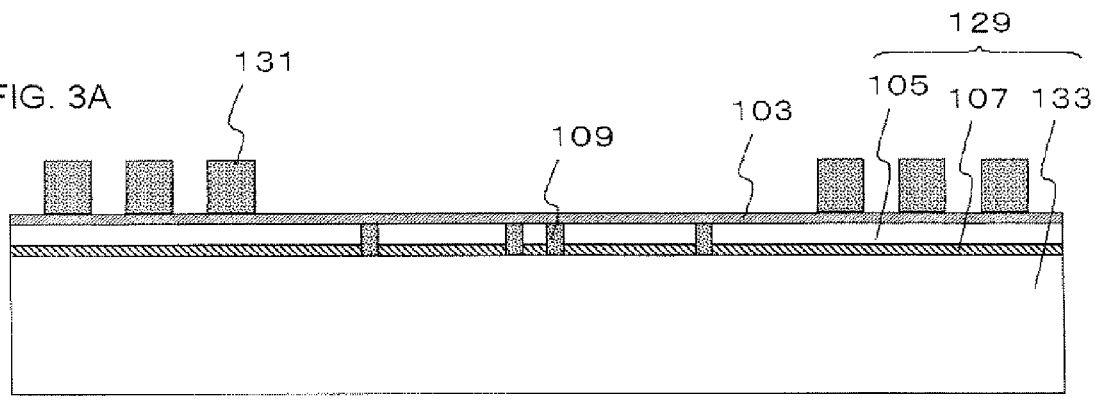
FIGS. 3A, 3B and 3C are cross-sectional process views schematically showing a manufacturing process of the semiconductor device according to the embodiment.

Next, a conductive post 131 that is a conductive plug 121 in FIG. 1 is formed on the interconnect layer 103 (FIG. 3A). The material of the conductive post 131 is capable of being employed with metals, such as for instance, copper or gold or the like. Moreover, the conductive post 131 is capable of being manufactured in such a way that a resist pattern, which causes a region to provide the conductive post 131 to be an opening, is provided on the interconnect layer 103, followed by causing a metal film to grow inside the opening by, for instance, an electroless plating technique of a semi-additive technique.

Figure 3B:
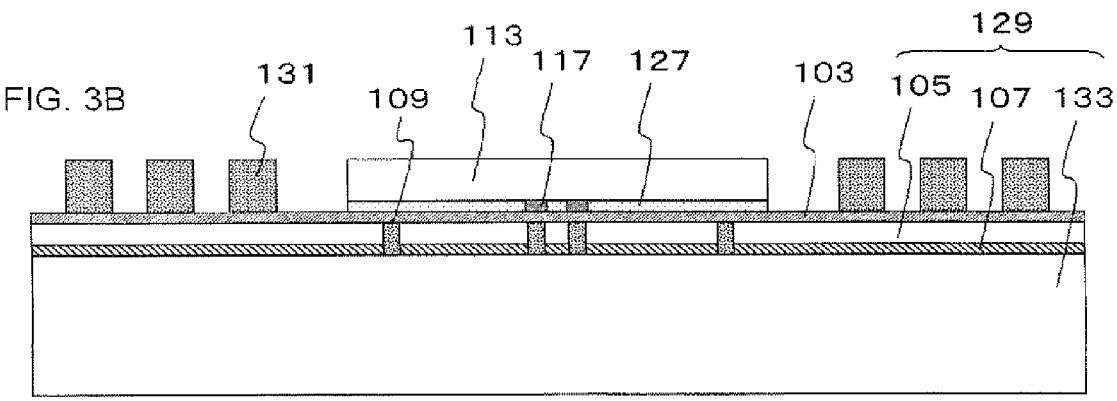

Next, the first semiconductor element 113 is electrically connected on the interconnect layer 103. As for the connecting method, it is possible to use various kinds of methods. For instance, a bump electrode is formed as an electrode 117, which is formed on the first semiconductor element 113 in advance. And then, it is possible to connect the first semiconductor element 113 with the interconnect layer 103 upon performing a bump bonding between the electrode 117 and the interconnect inside the interconnect layer 103. At this time, it is possible to use the flip-chip bonding technique. It is possible to connect the interconnect layer 103 with the first semiconductor element 113 surely by the simple technique upon using the flip-chip bonding technique. In addition, as for another connecting technique, for instance, it is possible to employ an activated bonding technique in which a surface of the interconnect layer 103 and a surface of the first semiconductor element 113 are pressed and bonded in a state where both surfaces are activated by a method such as plasma irradiation or the like. After bonding, the underfill resin 127 is filled between the first semiconductor element 113 and the SOI substrate 129 (FIG. 3B).

Figure 3C:
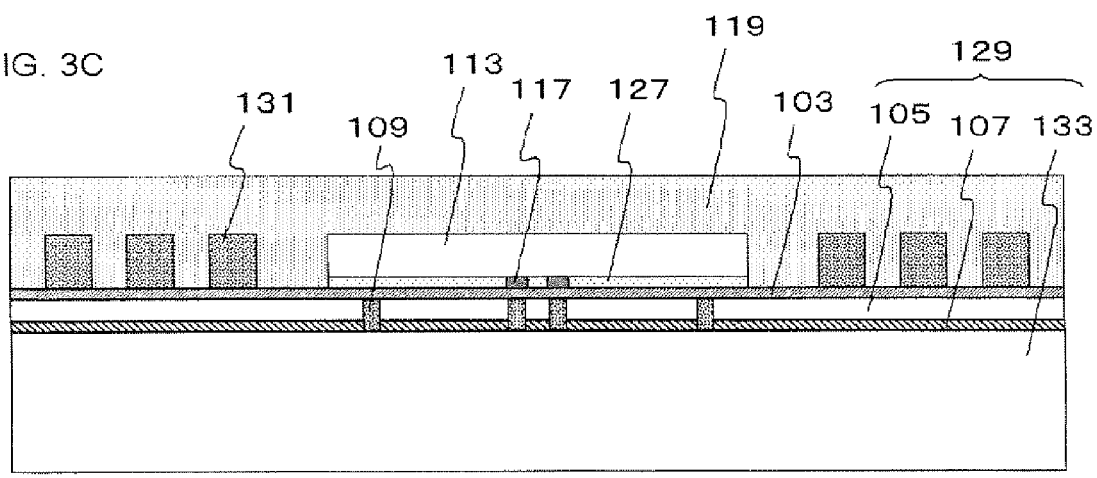

Next, the whole top face of the interconnect layer 103 is sealed with the insulating resin 119 with insulating property upon using a technique such as a transfer molding (FIG. 3C). Thereby, the first semiconductor element 113 and the conductive post 131 are embedded inside the insulating resin 119. Sealing method is capable of being selected from various kinds of methods such as a method for performing pressure bonding of the insulating resin sheet or a method for curing a liquid resin after applying the liquid resin, in addition to the above method.

Next, the insulating resin 119 is made thin by grinding of forming face side of the insulating resin 119 or the like to expose an upper face of the first semiconductor element 113 and an end portion of the conductive post 131 (FIG. 4A). It should be noted that this process is also capable of being performed after removing (FIG. 4B) of a silicon substrate 133 described later. Furthermore, in the forming the insulating resin 119 described above while using FIG. 3C, it is also possible to control a film thickness of the insulating resin 119 into a predetermined thickness in advance. In such a case, it is possible to omit an exposing the conductive post 131.

And then, the silicon substrate 133 is removed from a side of the back face of the bonding face of the first semiconductor element 113. As for the removing technique at this time, it is possible to employ a mechanical grinding, CMP, or chemical etching or the like. Moreover, as another removing technique, it is possible to employ a technique that a layer that is low in the adhesion is formed in advance on an interface between the silicon substrate 133 and the interconnect layer 103, and from a part of this layer that is low in the adhesion, the interposing layer is removed in turn. Further, an end face of the conductive via 109 is exposed upon removing a part of the insulating film 107 or a diffusion barrier (not shown in the drawing) (FIG. 4B). There is no limitation especially in the process to expose the conductive via 109. Various kinds of methods are capable of being selected.

Next, the second semiconductor element 111 is connected with the exposed conductive via 109. It is possible to use the method for connecting the first semiconductor element 113 (FIG. 3B) as the connecting method. For instance, an electrode 115 is formed on a face of the second semiconductor element 111, followed by bonding the silicon layer 105 to the conductive via 109, so that it is possible to connect with each other. After the connecting, it may be suitable to fill the underfill resin 125 between the second semiconductor element 111 and the SOI substrate 129 (FIG. 4C).

And then, an electrode terminal 123 such as solder bump or the like is formed on the exposed face of the conductive post 131. According to the above process, the semiconductor device 100 shown in FIG. 1 is manufactured. The above process, initially, is performed in a state where the semiconductor device is constituted by comprising a plurality of the second semiconductor elements 111 and a plurality of the first semiconductor elements 113 on the wafer, that is, the silicon substrate 133. However, after the sealing process by using the insulating resin 119, it is possible to separate the semiconductor device into a plurality of chips at an arbitrary position. Moreover, as described above, concerning the order of the process, change of reversing the order between removing the silicon substrate 133 and grinding of the insulating resin 119 or the like is possible.

Next, there will be described effects of the semiconductor device 100 shown in FIG. 1.

In the semiconductor device 100 shown in FIG. 1, the interconnect component 101 has a structure, in which the insulating film 107, the silicon layer 105 and the interconnect layer 103 are sequentially formed into a multi-layered structure. The semiconductor device has a structure where the through electrode constituted of the conductive component inside the interconnect layer 103 and the conductive via 109 provided by connecting with the conductive component extends through (penetrates) the interconnect component 101. Furthermore, the first semiconductor element 113 and the second semiconductor element 111 are faced to be bonded to both faces of the interconnect component 101.

It is possible to suppress occurring of warpage caused by difference of a thermal expansion coefficient, deterioration of bonding accuracy or deterioration of connecting reliability caused by residual thermal stress, upon providing the silicon layer 105 to be the support layer. Therefore, it is possible to realize connection with high accuracy and high reliability. Furthermore, even though the conductive via 109 is arranged with high density, it is possible to connect surely the interconnect component 101 with the first semiconductor element 113 and the second semiconductor element 111. For this reason, it is possible to realize high density arrangement of the through electrode structure extending through (penetrating) the interconnect component 101. It should be noted that the through electrode structure penetrating the interconnect component 101 is capable of being realized with a structure composed of a plurality of the conductive components.

Moreover, silicon devices, that is, the second semiconductor element 111 and the first semiconductor element 113 with the same thermal expansion coefficient are connected with both faces of the interconnect component 101 having the silicon layer 105 as the support layer. For this reason, the semiconductor device 100 is excellent in symmetry of structure. Consequently, the semiconductor device 100 is excellent in manufacturing stability, and has a structure where the first semiconductor element 113 is connected surely with the second semiconductor element 111.

Thus, in the semiconductor device 100, the connection with high density and excellent reliability is capable of being realized between the first semiconductor element 113 and the second semiconductor element 111, which are provided on both faces of the interconnect component 101. It is possible to perform connection between a plurality of chips or large-scale chips with high interconnect density, upon using the interconnect component 101 having the silicon layer 105 capable of enhancing connecting reliability to the semiconductor element.

For instance, the semiconductor device 100 has a constitution, which is capable of coping with also constitution where, for instance, an electrode pitch interval is not more than 50 μm (micrometer), that is, the minimum interval of the conductive via 109 is, for instance, not more than 50 μm (micrometer). Moreover, connecting structure through the interconnect component 101 with high density is realized. Therefore, high degree of freedom to in the designing of the chip size, electrode position, and the interconnect connection to an outside terminal is provided. If a logic LSI chip that generates high heating is employed as the second semiconductor element 111, it is possible to add heat radiation mechanism such as a heat spreader or the like to the logic LSI chip.

Furthermore, in the semiconductor device 100, a plurality of semiconductor elements, which are connected with both faces of the flat plate shaped interconnect component 101, are electrically connected with each other through the conductive via 109 penetrating the interconnect component 101 and the interconnects inside the interconnect layer 103, which connects with the conductive via 109. The first semiconductor element 113 and the second semiconductor element 111 are electrically connected with each other through the conductive via 109 to be the conductive plug penetrating the silicon layer 105 and the insulating film 107, and the interconnect inside the interconnect layer 103, therefore, it is possible to shorten a connecting distance between the first semiconductor element 113 and the second semiconductor element 111. For this reason, it is possible to increase processing speed for communication between the first semiconductor element 113 and the second semiconductor element 111.

Also, the semiconductor device has a structure excellent in electrical characteristics upon realizing high density connection with fine interconnect between a plurality of LSIs. Furthermore, the semiconductor device 100 has high degree of design freedom as compared with a multi-chip package such as the semiconductor device with conventional chip-on-chip (COC) structure. In accordance with this, it is possible to realize easily structure excellent in heat dissipating property. Moreover, it is possible to realize BGA type semiconductor device with high secondary mounting reliability. Further, thus the silicon substrate 133 is removed after one side of the interconnect component 101 including the first semiconductor element 113 bonded in high accuracy is resin-sealed. The second semiconductor element 111 is connected with an opposite face. Therefore, it is possible to realize electrical connection with high density between the semiconductor elements.

In addition, in the semiconductor device 100, an effect corresponding to enlargement of a bus width can be obtained because it is possible to realize electrical connection with high density between the semiconductor elements. For this reason, it is possible to realize high speed operation and the reduction of electric power consumption simultaneously. For instance, it is possible to reduce clock frequency at the same processing speed. Furthermore, it is possible to increase the processing speed in the same clock frequency.

Consequently, for instance, it is possible to apply the semiconductor device 100 to a chip-on-chip connection between a large capacity memory and the system LSI. At this time, it is possible to realize an increase in the number of multiple pins and a decrease in an interval of multiple pins of an electrode connecting such as the bump connecting or the like. Furthermore, the interconnect component 101 is provided between the semiconductor chip on which the logic circuit is formed and the memory chip on which a memory element such as DRAM or the like is provided, and it is possible to use preferably as a connecting component connecting them.

Moreover, in the semiconductor device 100, a layer composed of the insulating resin 119 is formed at least on one side of the interconnect component 101. Specifically, a layer of the insulating resin 119 is formed on a face of a side of the interconnect layer 103 of the interconnect component 101. Furthermore, an electrode terminal 123 is formed on an exposed face from the insulating resin 119 of the conductive plug 121, which extends through (penetrates) the insulating resin 119, connected with the interconnect inside the interconnect layer 103. More excellent secondary mounting reliability in a thermal stress reducing function can be obtained upon employing a structure in which the conductive plug 121 to be a resin penetrating through hole is used.

Moreover, in the semiconductor device 100, the flat plate shaped interconnect component 101 is formed on the silicon substrate 133. The interconnect component 101 to perform electrical connection between the semiconductor elements is formed on the silicon substrate 133 with high rigidity; therefore it is possible to make an interconnect pattern fine.

Moreover, the semiconductor device 100 is obtained in such a way that the silicon substrate 133 is removed, after the interconnect component 101 is provided on the silicon substrate 133 and bonding the first semiconductor element 113 on the interconnect component 101. It is possible to suppress deterioration of connecting stability due to discrepancy of the thermal expansion coefficient in a connecting process between the first semiconductor element 113 and the conductive material inside the interconnect component 101 upon using the silicon substrate 133. For this reason, the bonding with very high accuracy and high reliability can be realized.

Furthermore, the semiconductor device 100 is manufactured in such a way that an LSI, that is, the second semiconductor element 111 is connected to also an opposite face, after removing the silicon substrate 133. Thus, the semiconductor device 100 has a constitution in which connection with high density and stability is realized between a plurality of LSIs with the fine interconnect. Therefore, it is possible to achieve suitable operating characteristics, which cannot be realized with the conventional system-in-package (SiP).

Figure 5:
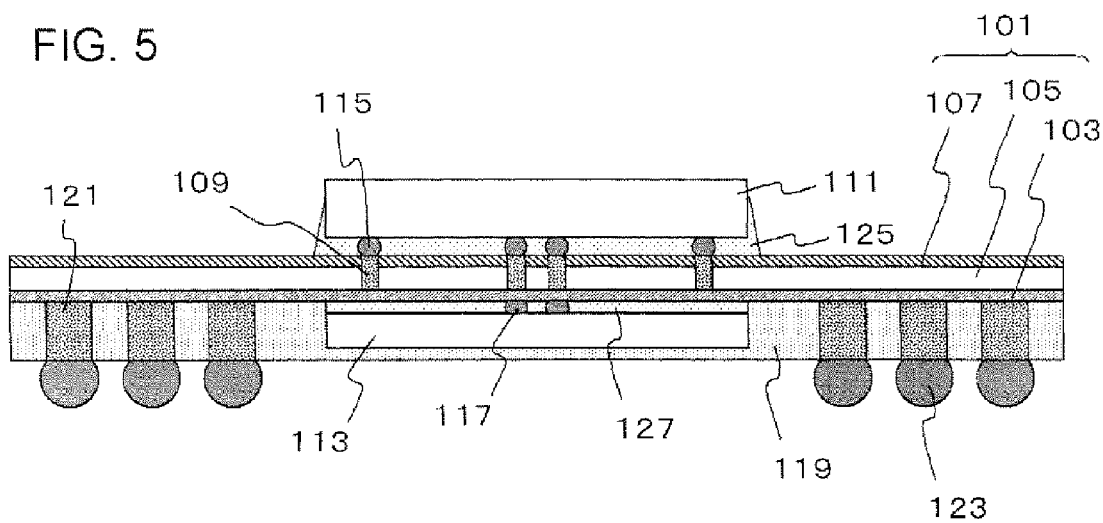
FIG. 5 is a cross-sectional view schematically showing the configuration of the semiconductor device according to the embodiment.

It should be noted that, in the semiconductor device 100 shown in FIG. 1 and the semiconductor device described in the later embodiments, it is also possible to realize a constitution in which the first semiconductor element 113 is embedded in the insulating resin 119. FIG. 5 is a cross-sectional view schematically showing a semiconductor device having a structure in which the first semiconductor element 113 is embedded inside the insulating resin 119.

Further, in the semiconductor device 100 shown in FIG. 1 and in the semiconductor device having the silicon layer 105 described in the later embodiments, an active element such as a transistor or the like may be formed on the silicon layer 105 to be the support layer. In such a way as above, it is possible to make the interconnect component 101 further high performance.

Figure 6:
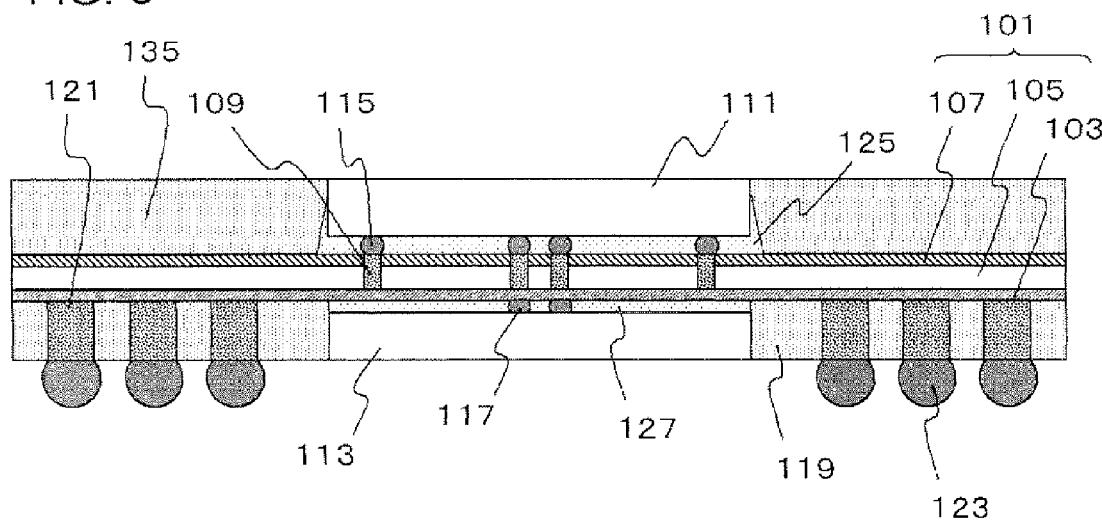
FIG. 6 is a cross-sectional view schematically showing the configuration of the semiconductor device according to the embodiment.

Furthermore, in the semiconductor device 100 and in the semiconductor device 100 described in the later embodiments, the insulating resin may be provided on a face of a side to which the second semiconductor element 111 of the interconnect component 101 is bonded. FIG. 6 is a cross-sectional view schematically showing a structure of the flip-chip type semiconductor device provided with the insulating resin 135 covering a side wall of the second semiconductor element 111 and a face of the insulating film 107. It is possible to enhance strength of the semiconductor device upon making the both faces of the interconnect component 101 sealed structures, which is sealed by the insulating resin 119 and the insulating resin 135. Furthermore, it is possible to enhance symmetry of structure of both faces of the interconnect component 101; therefore, it is possible to improve manufacturing stability.

In the following embodiment, there will be mainly described the embodiment with respect to a part different from the first embodiment.

(Second Embodiment)

The semiconductor device 100 (FIG. 1) described in the first embodiment is provided with the interconnect component 101 of the structure in which the interconnect layer 103, the silicon layer 105 and the insulating film 107 are sequentially formed into a multi-layered structure. However, the interconnect component 101 may be a structure composed of a multi-layered component of the interconnect layer 103 and the silicon layer 105. FIG. 7 is a cross-sectional view schematically showing a structure of a semiconductor device 110 according to the present embodiment.

A basic structure of the semiconductor device 110 shown in FIG. 7 is approximately the same as the semiconductor device 100 (FIG. 1) described in the first embodiment. The semiconductor device 110 is different from the semiconductor device 100 in that the insulating film 107 is not provided therewith, and the second semiconductor element 111 is connected with a face of the silicon layer 105 of the interconnect component 101 through the electrode 115 and the underfill resin 127. Furthermore, in the semiconductor device 110, the conductive via 109 is electrically connected with the interconnect inside the interconnect layer 103 while extending through (penetrating) the silicon layer 105.

Figure 36A:
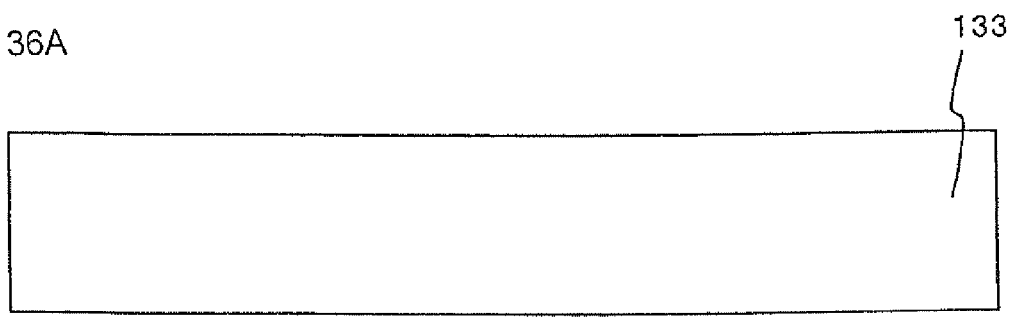
FIGS. 36A, 36B and 36C are cross-sectional process views schematically showing a manufacturing process of the semiconductor device according to the embodiment.
Figure 36B:
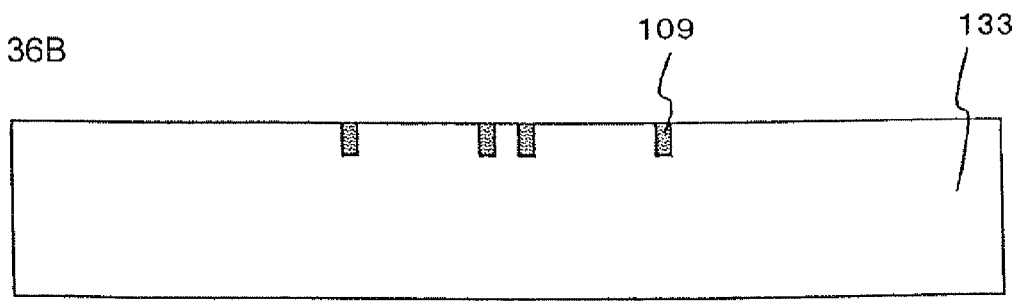
Figure 36C:
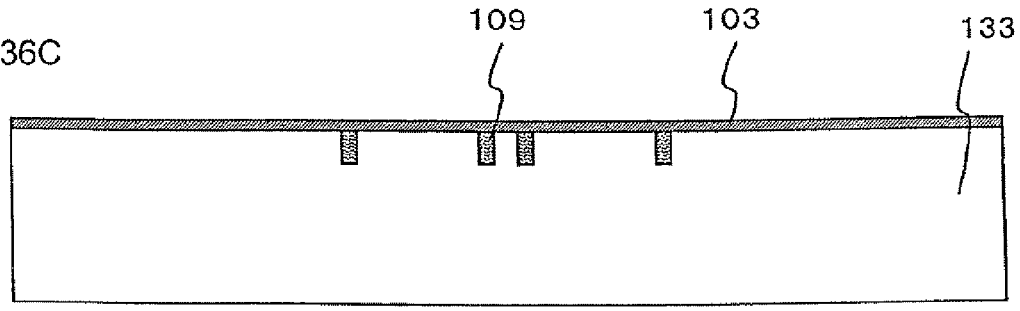
Figure 37A:
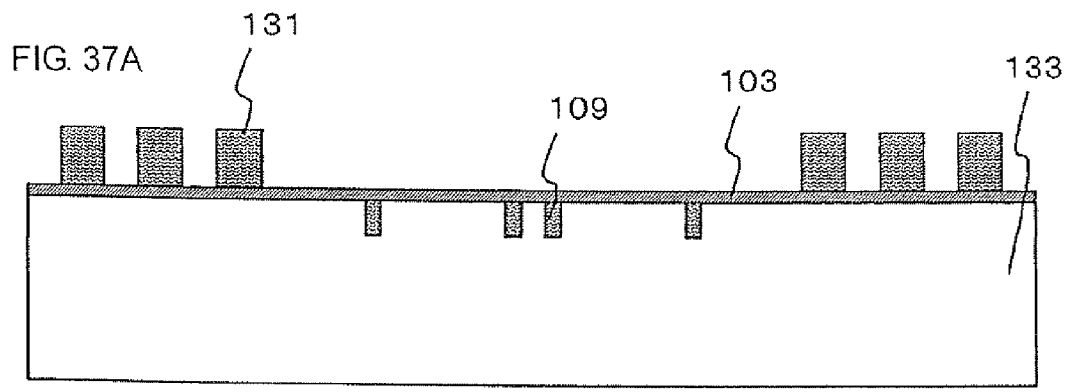
FIGS. 37A, 37B and 37C are cross-sectional process views schematically showing a manufacturing process of the semiconductor device according to the embodiment.
Figure 37B:
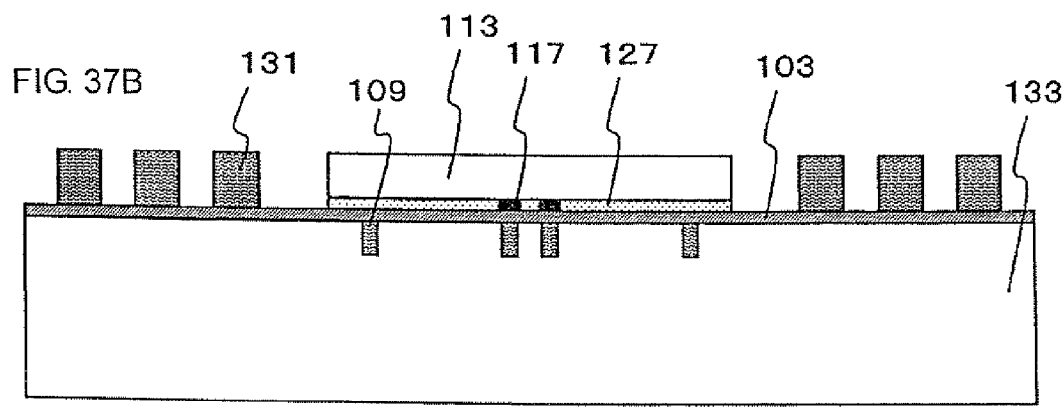
Figure 37C:
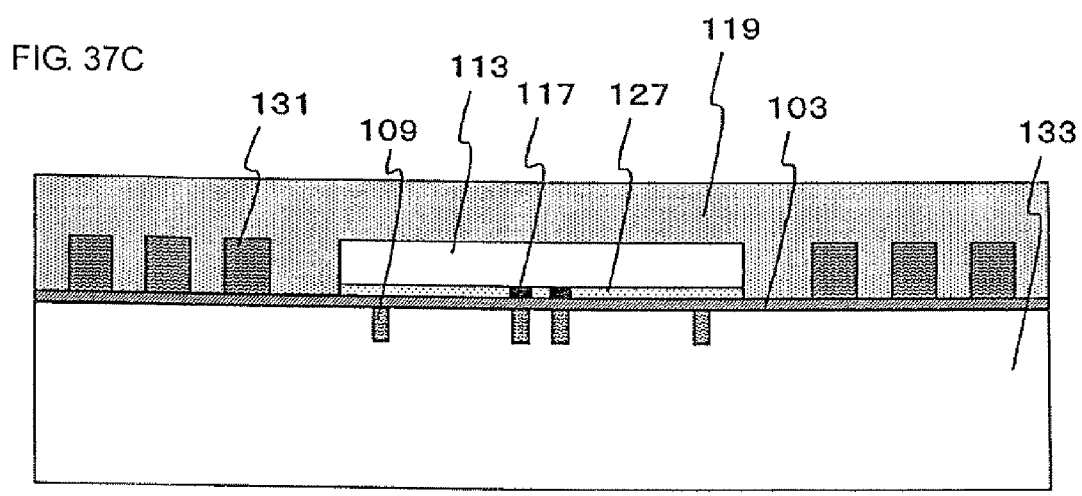

The semiconductor device 110 is capable of being manufactured using following process shown in FIGS. 36A to 36C, FIGS. 37A to 37C and FIGS. 38A to 38C. Firstly, the conductive via 109 is formed on the silicon substrate 133 (FIG. 36A and FIG. 36B), and the interconnect layer 103 is formed on a forming face of the conductive via 109 (FIG. 36C). Next, a conductive post 131 is formed on the interconnect layer 103 (FIG. 37A). Then, the first semiconductor element 113 is electrically connected over the interconnect layer 103, and the underfill resin 127 is filled between the first semiconductor element 113 and the silicon substrate 133 (FIG. 37B) Next, the whole top face of the interconnect layer 103 is sealed with the insulating resin 119 with insulating property upon using a technique such as a transfer molding (FIG. 37C). Next, the insulating resin 119 is made thin by grinding of forming face side of the insulating resin 119 and the like to expose an upper face of the first semiconductor element 113 and an end portion of the conductive post 131 (FIG. 38A). And then, the silicon substrate 133 is removed from a side of the back face of the bonding face of the first semiconductor element 113. Further, an end face of the conductive via 109 is exposed upon removing a part of the silicon layer 105 or a diffusion barrier (not shown in the drawing) (FIG. 38B). It should be noted that, in the process, the silicon substrate 133 is made thin from a rear face, and the silicon substrate 133 with predetermined thickness is remained as the silicon layer 105 without removing entirely the silicon substrate 133. Next, the second semiconductor element 111 is connected with the exposed conductive via 109 and the electrode 115. After the connecting, it may be suitable to fill the underfill resin 125 between the second semiconductor element 111 and the silicon layer 105 (FIG. 38C).

Also in the semiconductor device 110 shown in FIG. 7, the interconnect component 101 of the structure in which the interconnect layer 103 and the silicon layer 105 to be the support layer are sequentially formed into the multi-layered structure is provided. For this reason, the semiconductor device 110 has the structure in which difference of the thermal expansion coefficient at the time of bonding between the first semiconductor element 113 and the second semiconductor element 111 is small. Therefore, it is possible to secure sufficiently connecting reliability among them and it is possible to decrease sufficiently interval of the connected conductive via 109.

Moreover, in the semiconductor device 110, it is possible to utilize the silicon substrate 133 with bulk state; thus it is possible to provide the interconnect component 101 having the silicon layer 105 with predetermined thickness upon controlling grinding thickness of the silicon substrate 133. For this reason, it is not necessary to use an SOI substrate 129, thus it is possible to simplify the structure of the semiconductor device 110.

It should be noted that, in the semiconductor device 110, a face of the silicon layer 105 in the periphery of the conductive via 109 is insulated. Thereby, insulating characteristics between electrodes of the second semiconductor element 111 can be secured. In the semiconductor device 110 shown in FIG. 7, the semiconductor device 110 has the structure in which the periphery of the conductive via 109 is insulated, upon being embedded with the underfill resin 125 having insulating characteristics between the silicon layer 105 and the second semiconductor element 111.

(Third Embodiment)

Figure 8:
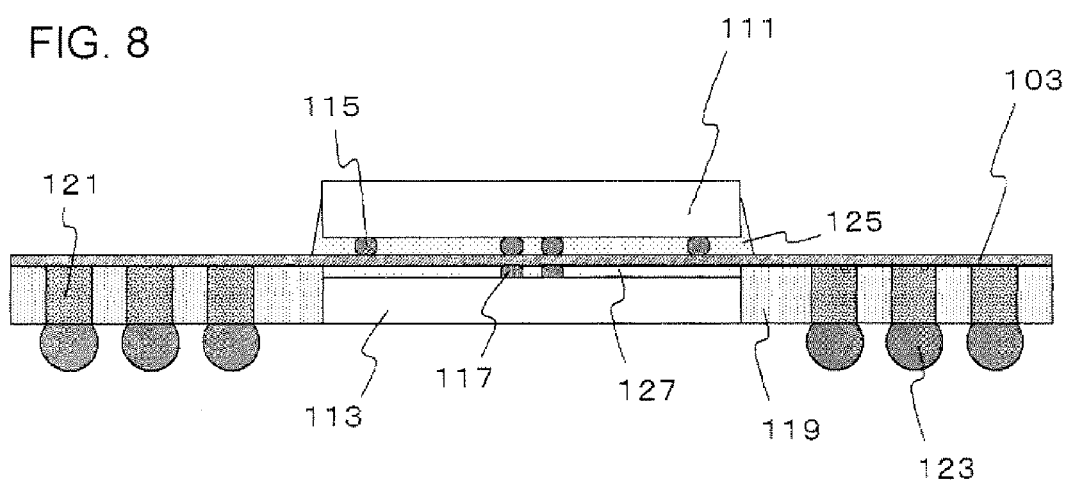
FIG. 8 is a cross-sectional view schematically showing the configuration of the semiconductor device according to the embodiment.

In the semiconductor device described in the above embodiments, the interconnect component 101 may be constituted of only the interconnect layer 103. FIG. 8 is a cross-sectional view schematically showing a structure of a semiconductor device 120 according to the present embodiment.

A basic structure of the semiconductor device 120 shown in FIG. 8 is approximately the same as the semiconductor device 100 (FIG. 1) described in the first embodiment. However, the semiconductor device 120 is different from the semiconductor device 100 in that the interconnect component 101 is composed of only the interconnect layer 103, and the first semiconductor element 113 and the second semiconductor element 111 are provided in such a way as to face to different faces of the interconnect layer 103. Further, the semiconductor device 120 is different from the semiconductor device 100 in that the second semiconductor element 111 is connected with a face of the interconnect layer 103 through the electrode 115 and the underfill resin 125.

In the semiconductor device 120, the interconnect component 101 composed of the interconnect layer 103 is capable of being manufactured using, for instance, the following process. FIGS. 9A to 9C and FIGS. 10A to 10C are cross-sectional process views schematically showing manufacturing process of the interconnect layer 103.

Figure 9A:
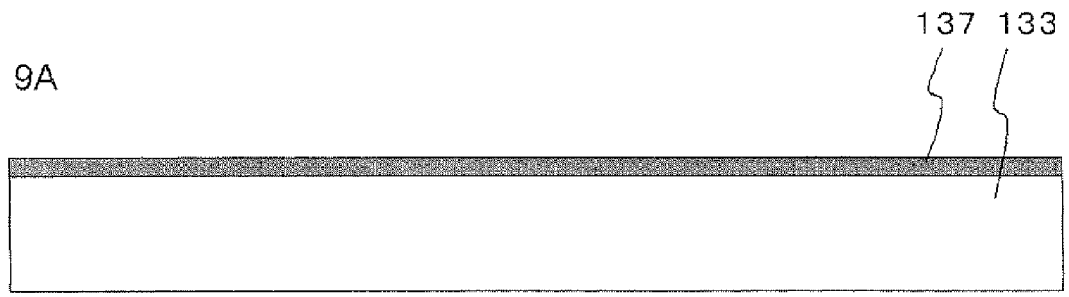
FIGS. 9A, 9B and 9C are cross-sectional process views schematically showing a manufacturing process of the semiconductor device according to the embodiment.
Figure 9B:
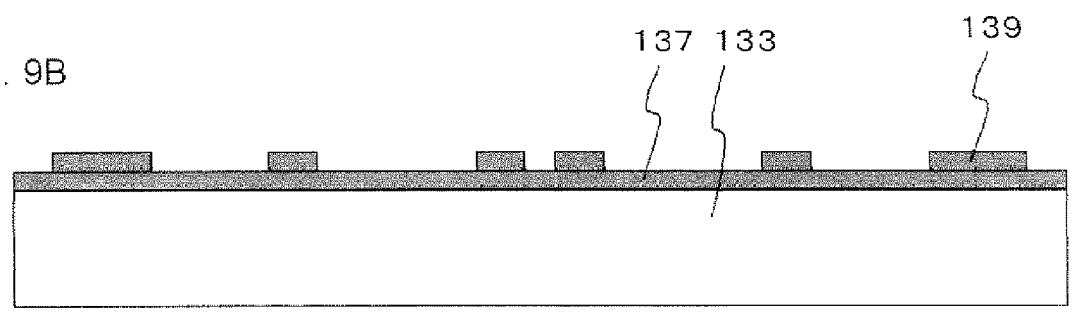

Firstly, a metal seed layer 137 is formed on a face of the silicon substrate 133 using the sputtering technique or the like (FIG. 9A). The seed layer 137 is capable of being realized by, for instance, Ni layer. Next, a resist pattern to expose a position for forming interconnect is formed on the seed layer 137, followed by forming a connection electrode 139 having a predetermined pattern, with an exposed portion of the seed layer 137 as a starting point (FIG. 9B). The connection electrode 139 is an electrode at a lower side of an insulating resin film 141 described later. The connection electrode 139 is capable of being used as an external lead-out electrode. The connection electrode 139 is capable of being formed using, for instance, electrolytic plating technique.

The material of the connection electrode 139 is capable of being formed of metals of Cu, Al, Au, Ni, W or the like or various kinds of conductive materials such as alloy, metal silicide, polysilicon; and it is also possible to employ a multi-layered structure including a diffusion barrier of a solder or a support layer of electrode strength in addition to a single-layer structure. As for the electrode with the multi-layered structure, it is possible to employ an electrode where Au, Ni and Cu are sequentially formed from a lower end side into a multi-layered structure (Au/Ni/Cu electrode), an electrode where Ni, Au, Ni, and Cu are sequentially formed from a lower end side into multi-layered structure (Ni/Au/Ni/Cu electrode), an Au/Ni/CU electrode where Ni layer of the most lower end layer is removed from the Ni/Au/Ni/Cu electrode, and an electrode where Cu, Ag and Cu are sequentially formed from a lower end side into a multi-layered structure (Cu/Ag/Cu electrode). In the above described electrodes, the Ni layer of the intermediate layer functions as a diffusion barrier preventing solder from being diffused. Furthermore, in the Cu/Ag/Cu electrode, the Ag layer functions as a support layer enhancing strength of the electrode.

Figure 9C:
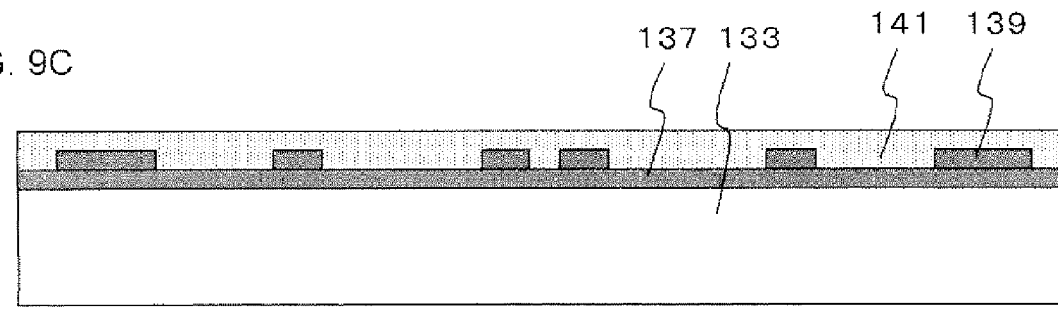
Figure 10A:
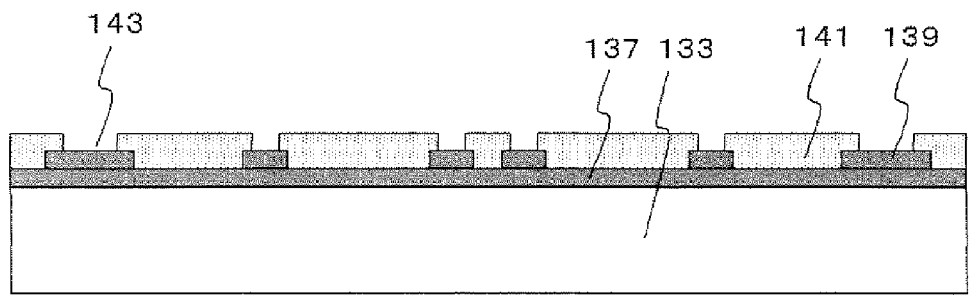
FIGS. 10A, 10B and 10C are cross-sectional process views schematically showing a manufacturing process of the semiconductor device according to the embodiment.

Next, the connection electrode 139 is embedded with the insulating resin, upon providing the insulating resin film 141 over the whole face of a forming face of the connection electrode 139 (FIG. 9C). The insulating resin film 141 is capable of being formed using, for instance, a method for bonding an insulating resin sheet with laminated film shape or a spin coat technique or the like. And then, a laser via, that is, an opening 143 is provided upon irradiating laser beam to predetermined position of the insulating resin film 141 (FIG. 10A). Further, it may be suitable to form the opening 143 depending on the photolithography technique while using photosensitive resin for the insulating resin film 141.

Figure 10B:
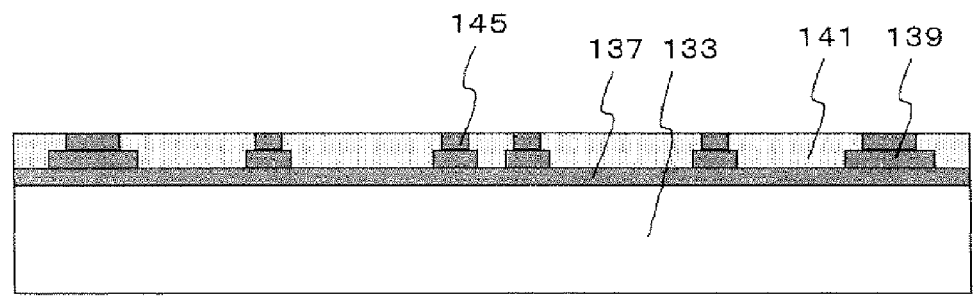
Figure 10C:
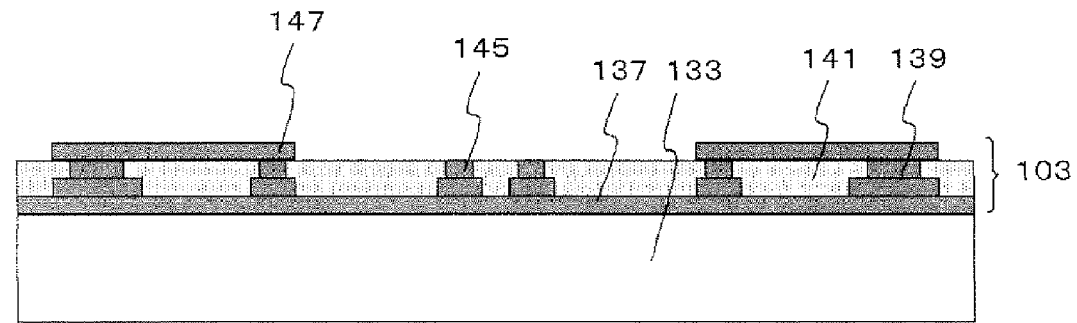

After that, the opening 143, which is embedded with predetermined metal film such as Cu or the like, is made to be a via plug 145 (FIG. 10B). And then, an interconnect 147, which is connected with the via plug 145, having a predetermined pattern is formed on the insulating resin film 141 (FIG. 10C). The material of the interconnect 147 is set to metal, such as for instance, Cu or the like. And then, a plating layer (not shown in the drawings) composed of Au/Ni from the upper layer is formed on a face of the interconnect 147. Using the above process, the multi-layered interconnect layer 103 is formed on the silicon substrate 133.

It should be noted that there is no limitation especially in planar arrangement of the via plug 145, so that it is possible to appropriately select in accordance with design of the semiconductor device 120. For instance, it is possible to arrange the via plug 145 into a tetragonal lattice shape, or it is possible to arrange the via plug 145 into a diagonal lattice shape such as a staggered lattice shape or the like.

The semiconductor device 120 shown in FIG. 8 is capable of being manufactured using the manufacturing process of the semiconductor device 110 (FIG. 7) described in the second embodiment, after manufacturing the interconnect layer 103 on the silicon substrate 133 with the above process. Here, in the structure of the semiconductor device 110, the interconnect component 101 has the structure having the silicon layer 105, therefore, the silicon substrate 133 is made thin, however, the structure of the semiconductor device 120 according to the present embodiment does not have the silicon layer 105, thereby, the silicon substrate 133 is removed in the same case as the first embodiment, after bonding the first semiconductor element 113. And then, the second semiconductor element 111 is bonded to the interconnect component 101.

In the semiconductor device 120 (FIG. 8, FIG. 10C) thus obtained, the connection electrode 139 is provided on a side of the second semiconductor element 111 of the insulating resin film 141. The connection electrode 139 includes an element connection electrode connecting the second semiconductor element 111 with the first semiconductor element 113, and an external connection electrode connecting the second semiconductor element 111 with an outside. The whole side face of the connection electrode 139 is embedded inside the insulating resin film 141, whenever the connection electrode 139 corresponds to any of the above cases. While, the whole faces on opposite side to the insulating resin 119 of the connection electrode 139 are exposed from the insulating resin film 141, resulting in the structure where the connection electrode 139 does not come into contact with the insulating resin film 141 at the exposed faces.

Therefore, it is possible to realize high density arrangement of the connection electrode 139. Further, it is possible to insulate surely a side face outer periphery of the connection electrode 139. Furthermore, it is possible to insulate surely the periphery of the electrode terminal 123, upon providing surely the electrode terminal 123 on a predetermined region, while making a face of a side of the second semiconductor element 111 of the interconnect layer 103 a flat face.

Moreover, when employing the connection electrode 139 as an external connection electrode, it is possible to realize connection with high density and short connecting distance, as compared to the connection based on the conventional wire bonding.

It should be noted that, in the semiconductor device 120, the connection electrode 139 may be constituted such that a plurality of conductive components are bonded. Further, the exposed face of the connection electrode 139 from the insulating resin film 141 may not be a flat face. For instance, the exposed face of the connection electrode 139 may be a curved face projecting convexly from a face of the insulating resin film 141. Furthermore, the connection electrode 139 may allow the bump electrode to be bonded to the exposed face from the insulating resin film 141.

Sufficient height to bond the connection electrode 139 to another connection component is secured by making the exposed face from the insulating resin film 141 of the connection electrode 139 a curved face. Such structure is capable of being obtained upon forming a curved face shaped electrode on the exposed face of the connection electrode 139, for instance, using an electroless plating technique or the like.

Further, the semiconductor device 120 shown in FIG. 8 is capable of being manufactured upon utilizing silicon substrate 133 with bulk state. For this reason, it is possible to connect the first semiconductor element 113 with the second semiconductor element 111 with high density interconnect structure and low cost. Furthermore, the semiconductor device 120 has simple constitution because the interconnect component 101 is composed of the interconnect layer 103. Therefore, it is possible to simplify the manufacturing process, and to reduce the manufacturing cost.

In the first semiconductor element 113 and the second semiconductor element 111, when employing structure in which the substrate with a linear expansion coefficient to be not less than 0.5 ppm/degree C. to not more than 5 ppm/degree C. is used, it is possible to reduce the difference of the thermal expansion coefficient between the first semiconductor element the silicon substrate and between the second semiconductor element and the silicon substrate 133. Therefore, it is possible to enhance the connecting reliability between the interconnect component 101 and the first semiconductor element 113 as well as the second semiconductor element 111. Moreover, in accordance with a kind of the substrate of the first semiconductor element 113 and the second semiconductor element 111, the semiconductor device 120 may be manufactured, while using materials with small difference of the linear expansion coefficient as compared with the substrate of the semiconductor elements instead of the silicon substrate 133 with bulk state.

Moreover, the first semiconductor element 113 and the second semiconductor element 111 may be the elements, which have the silicon substrate. In this case, the effect generated by using the silicon substrate 133 with bulk state is exhibited remarkably. For this season, the conductive via 109 with high density, which the conductive via 109 connects the first semiconductor element 113 with the second semiconductor element 111, is provided; and it is possible to realize connection between the semiconductor elements with high density.

Further, side faces of the connection electrode 139 and the via plug 145 inside the interconnect layer 103 are covered with the insulating resin film 141, therefore, when connecting a solder bump with an end face of the connection electrode 139 as the electrode 115 or as the electrode 117, it is possible to suppress connection defects caused by flowing of the solder.

Furthermore, the semiconductor device 120 has a structure in which the semiconductor element is bonded to both faces of the interconnect component 101, so that the semiconductor device 120 has a structure with high symmetric property. For this reason, it is possible to sufficiently secure the connecting reliability between the second semiconductor element 111 and the first semiconductor element 113.

Further, a face of a side of the interconnect layer 103 of the first semiconductor element 113 and a face of a side of the interconnect layer 103 of the second semiconductor element 111 are connected with a face of the interconnect layer 103 approximately perpendicularly and in a straight line. Therefore, the semiconductor 120 has the structure wherein connecting distance is reduced and the stable connection is secured. It should be noted that if the connection is realized without the interconnect extending in the horizontal direction in an inside of the interconnect component 101, it is not necessary for the connection between the semiconductor elements to be completely perpendicular. Moreover, in the present embodiment, it is possible to enhance density of the minimum interval of the conductive components provided in the perpendicular direction to a face of the interconnect component 101 to be, for instance, not more than 50 μm (micrometer).

In the present embodiment, the semiconductor device having the interconnect component 101 composed of the interconnect layer 103 may have the following structure.

Figure 31:
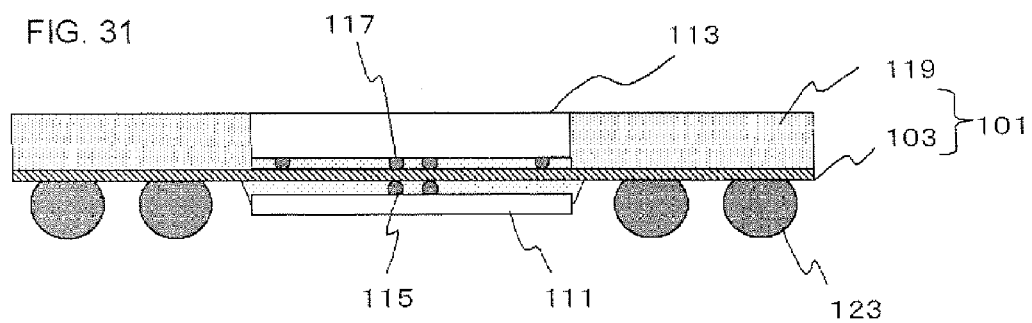
FIG. 31 is a cross-sectional view schematically showing the configuration of the semiconductor device according to the embodiment.

FIG. 31 is a cross-sectional view schematically showing a structure of the semiconductor device according to the present embodiment. A basic structure of a semiconductor device 150 shown in FIG. 31 is approximately the same as the semiconductor device 120 shown in FIG. 8. However the semiconductor device 150 is different from the semiconductor device 120 in that there is no conductive plug 121 extending through (penetrating) inside the insulating resin 119, and there is an electrode terminal 123, which is provided in such a way as to come into contact with a face of a side of the second semiconductor element 111 of the interconnect component 101, connected with an interconnect inside the interconnect component 101.

The semiconductor device 150, like the semiconductor device 120 shown in FIG. 8, has the flat plate shaped insulating resin film 141 and a conductive component extending through (penetrating) the insulating resin film 141; therefore, it is possible to surely connect the first semiconductor element 113 with the second semiconductor element 111 in high density. Furthermore, the semiconductor device 150 has a constitution where it is possible to simplify the manufacturing process in that the semiconductor device 150 is capable of being manufactured without providing a process to provide the conductive plug 121 inside the insulating resin 119.

Figure 32:
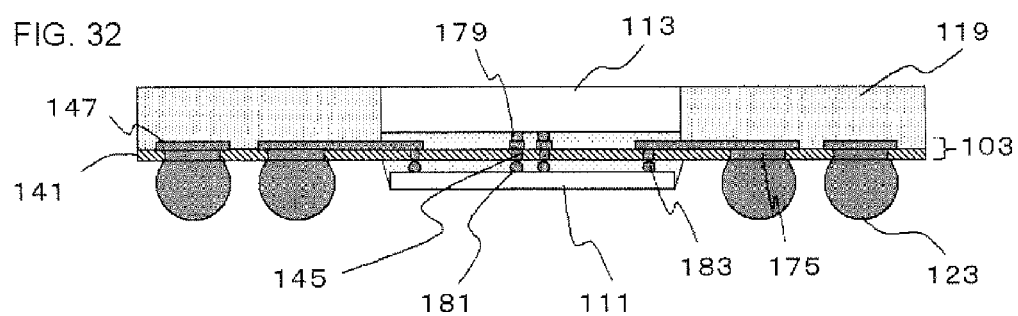
FIG. 32 is a cross-sectional view schematically showing the configuration of the semiconductor device according to the embodiment.
Figure 33:
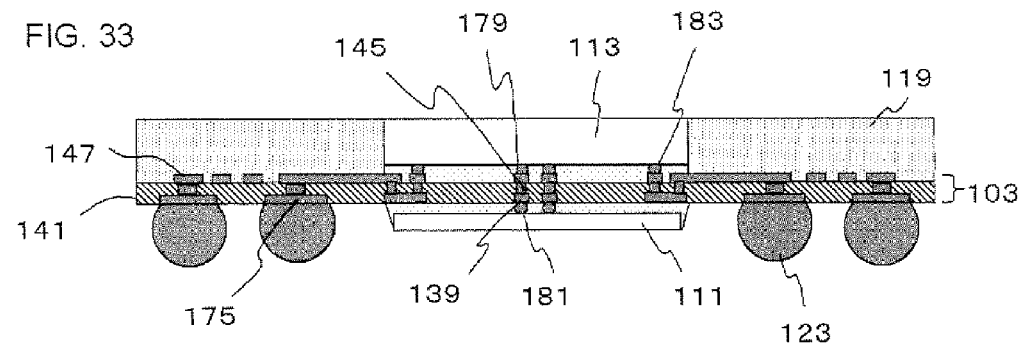
FIG. 33 is a cross-sectional view schematically showing the configuration of the semiconductor device according to the embodiment.

FIGS. 32 and 33 are cross-sectional views showing structure of the interconnect layer 103 of the semiconductor device 150 shown in FIG. 31 in detail.

In the semiconductor device shown in FIG. 32, a structure is exemplified in which the interconnect layer 103 is formed with dual-layered structure composed of a layer on which a via plug 145 and a pad 175 are provided, and a layer on which an interconnect 147 is provided. It should be noted that, in the layer in which the via plug 145 and the pad 175 are provided, the predetermined interconnects in addition to the via plug 145 and the pad 175 may be also formed.

In the semiconductor device shown in FIG. 32, the electrode terminal 123 is connected to the interconnect 147. Further, the interconnect 147 is connected to the predetermined via plug 145 or the pad 175.

The via plug 145 and the pad 175 are the connection electrode provided on the second semiconductor element 111 of the insulating resin film 141. The via plug 145 and the pad 175 correspond to the connection electrode 139 in the above described FIG. 10C. The whole side faces of the connection electrodes thereof are embedded inside the insulating resin film 141, and the whole faces on opposite side to the insulating resin 119 of the connection electrode are exposed from the insulating resin film 141; in this face, the connection electrode has the structure where the connection electrode does not come into contact with the insulating resin film 141. Therefore, it is possible to selectively provide the electrode terminal 123 on a predetermined region, while making the interconnect layer 103 a flat face.

It should be noted that, in the semiconductor device shown in FIG. 32, the via plug 145 is an element connection electrode connecting with the second semiconductor element 111; and the pad 175 is an external lead-out pad connecting with the electrode terminal 123, that is, an external connection electrode.

The interconnect 147 is provided on a connection face of the first semiconductor element 113 of the insulating resin film 141. A side face of the interconnect 147 and a face of a side of the insulating resin 119 are not embedded in the insulating resin film 141, so that the faces are exposed from the insulating resin film 141. Further, the exposed portion is embedded inside the insulating resin 119. Thereby, strength of the interconnect layer 103 is sufficiently secured.

It should be noted that, in the semiconductor device shown in FIG. 32, the first semiconductor element 113 may be employed as a memory chip, and the second semiconductor element 111 may be employed as a logic chip. At this time, as the electrode 115 in FIG. 31, it is possible to provide an electrode for connecting to memory 179 connecting the second semiconductor element 111 with the first semiconductor element 113, and an external input/output electrode 183 connecting the second semiconductor element 111 with the electrode terminal 123. Further, as the electrode 117 in FIG. 31, it is possible to provide a memory electrode 181 connecting the first semiconductor element 113 with the second semiconductor element 111.

Furthermore, a basic structure of the semiconductor device shown in FIG. 33 is approximately the same as that shown in FIG. 32, however, the semiconductor device shown in FIG. 33 is different from the semiconductor device shown in FIG. 32 in that the via plug 145 and the pad 175 are provided on different layers each. For this reason, the interconnect layer 103 in which a layer of a pad 175, that is, a layer of the connection electrode 139, a layer of the via plug 145 and a layer of the interconnect 147 are sequentially formed into a three-layered structure, so that the number of layer of which is larger than that of FIG. 32 by one layer. In this structure, a layer having the connection electrode 139 is a layer of the connection electrode in which one face is exposed from the insulating resin film 141. A part of the connection electrode 139 is an element connection electrode connecting to the second semiconductor element 111, and another part is the pad 175 connecting to the electrode terminal 123.

Further, in the semiconductor device shown in FIG. 33, the second semiconductor element 111 may be employed as a memory chip, and the first semiconductor element 113 may be employed as a logic chip. At this time, contrary to the example of the semiconductor device structure shown in FIG. 32, it is possible to provide a memory electrode 181 as the electrode 115 of FIG. 31, and an electrode for connecting to memory 179 and an external input/output electrode 183 as the electrode 117 of FIG. 31.

It should be noted that, in the semiconductor device 150 shown in FIG. 31, structure and the number of layer of the interconnect layer 103 are not limited to an embodiment shown in FIGS. 32 and 33, and it is possible to set the structure and the number of layer of the interconnect layer 103 appropriately in accordance with the structure of the semiconductor device. In addition, the interconnect layer 103 in the semiconductor device shown in FIGS. 32 and 33 is capable of being manufactured, for instance, using a method later described in the seventh embodiment.

Figure 34:
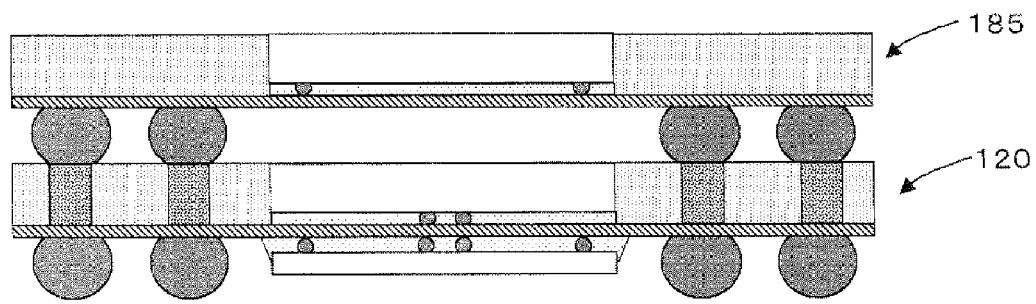
FIG. 34 is a cross-sectional view schematically showing the configuration of the semiconductor device according to the embodiment.
Figure 35:
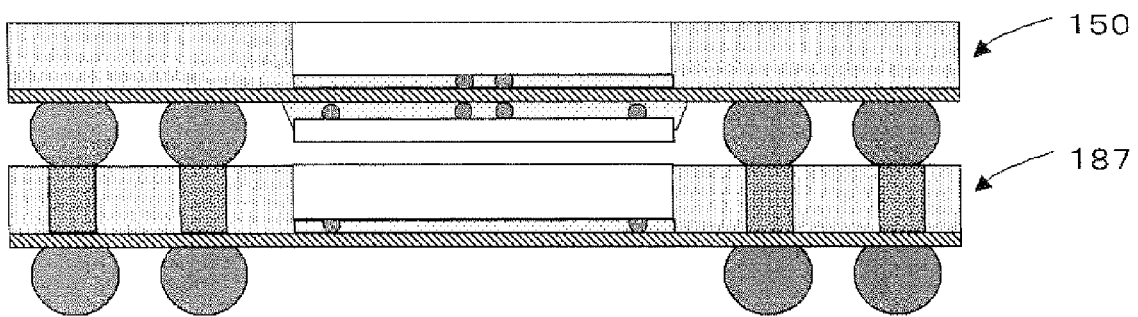
FIG. 35 is a cross-sectional view schematically showing the configuration of the semiconductor device according to the embodiment.

Further, the semiconductor device according to the present embodiment is capable of being used in such a way that the semiconductor device is connected with another semiconductor device to be formed with the multi-layered structure. FIGS. 34 and 35 are cross-sectional views schematically showing structure of such semiconductor devices.

FIG. 34 is a view showing structure in which the semiconductor device 120 shown in FIG. 8 is connected with another semiconductor device 185. The semiconductor device 120 is connected with the semiconductor device 185 through an electrode terminal provided on the semiconductor device 185 and the conductive plug 121 provided on the semiconductor device 120.

Further, FIG. 35 is a view showing structure in which the semiconductor device 150 shown in FIG. 31 is connected with another semiconductor device 187. The semiconductor device 150 is connected with the semiconductor device 187 through an electrode terminal 123 provided on the semiconductor device 150 and the conductive plug provided on the semiconductor device 187.

It should be noted that, in the present embodiment, the structure of the interconnect component 101 composed of the interconnect layer 103 may be employed as the structure later described in the seventh embodiment. Furthermore, it is also possible to apply the structure of the present embodiment to the semiconductor device described in the seventh embodiment.

(Fourth Embodiment)

Figure 11:
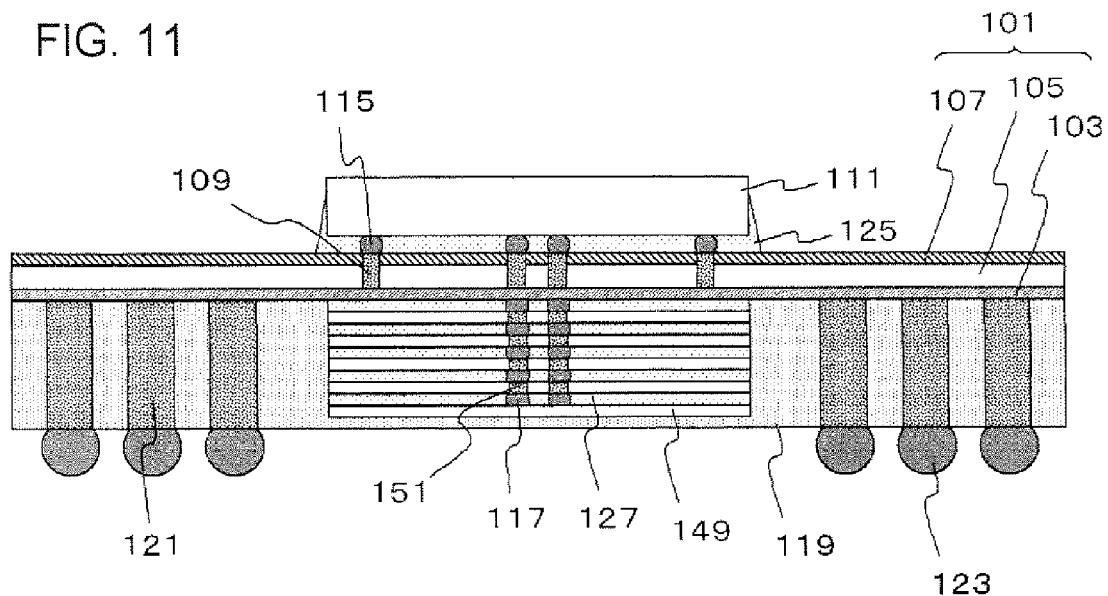
FIG. 11 is a cross-sectional view schematically showing the configuration of the semiconductor device according to the embodiment.

In the semiconductor device 100 described in the first embodiment, the first semiconductor element 113 bonded to a side of the interconnect layer 103 of the interconnect component 101 may be a multi-layered component composed of a plurality of semiconductor elements. FIG. 11 is a cross-sectional view schematically showing structure of the semiconductor device according to the present embodiment. A basic structure of the semiconductor device shown in FIG. 11 is approximately the same as the semiconductor device 100 (FIG. 1) described in the first embodiment, however, the semiconductor device shown in FIG. 11 is different from the semiconductor device 100 in that a plurality of semiconductor elements 149 are formed with the multi-layered structure, which is formed along a normal line of a face, instead of the first semiconductor element 113.

In the semiconductor device shown in FIG. 11, a plurality of semiconductor elements 149 are formed into the multi-layered structure according to constitution by providing repeatedly the underfill resin 127, the semiconductor element 149, the underfill resin 127, the semiconductor element 149, . . . , the underfill resin 127, the semiconductor element 149 on a face of the interconnect layer 103 of the interconnect component 101. The conductive plug 151 extending through (penetrating) the semiconductor element 149 is provided on the respective semiconductor elements 149. Further, an electrode 117 connecting two adjacent semiconductor elements 149 therebetween is provided on the respective underfill resins 127.

The semiconductor device shown in FIG. 11 has the structure where a plurality of multi-layered semiconductor elements 149 are connected with a side of a forming face of the insulating resin 119; and electrical connection is realized between the multi-layered semiconductor elements 149 through the conductive plug 151 penetrating the semiconductor elements 149. Specifically, the plurality of semiconductor elements 149 are electrically connected with the interconnect component 101 according to repetition structure of the electrode 117 and the conductive plug 151 composed of the electrode 117 connecting to the interconnect layer 103, the conductive plug 151, the electrode 117, the conductive plug 151, the electrode 117. The repetition structure of the electrode 117 and the conductive plug 151 is formed in the direction of the normal line to a face of the interconnect component 101 on an approximate straight line. Thereby, the semiconductor device shown in FIG. 11 has the structure excellent in connecting reliability in that connecting distance between the semiconductor elements 149 is short.

Figure 12:
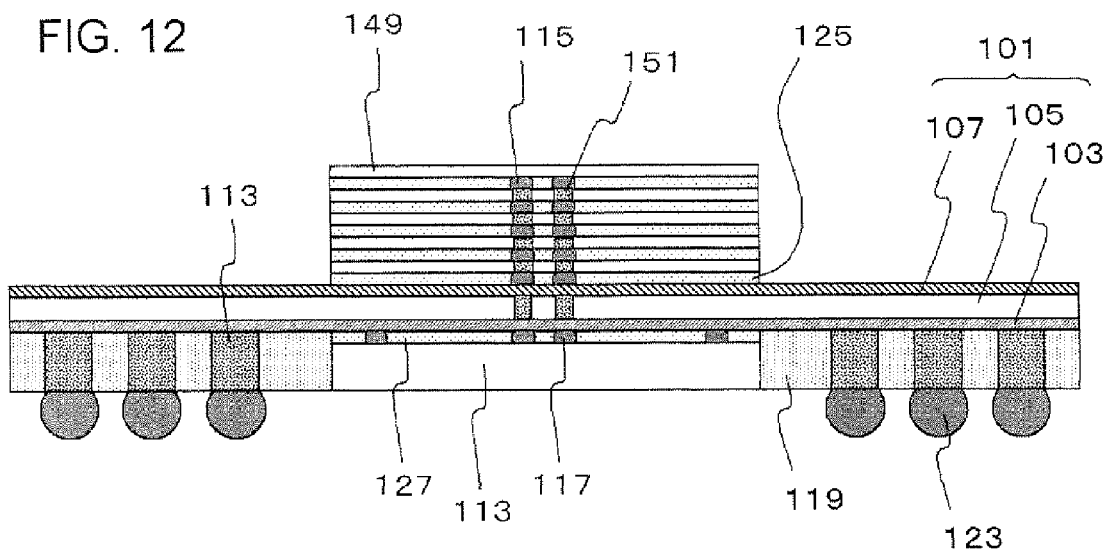
FIG. 12 is a cross-sectional view schematically showing the configuration of the semiconductor device according to the embodiment.

Further, in the semiconductor device shown in FIG. 11, the multi-layered component of the semiconductor elements 149 is arranged on a side of the interconnect layer 103; however, the second semiconductor element 111 connected with a face of a side of the insulating film 107 of the interconnect component 101 may have the multi-layered structure composed of the plurality of semiconductor elements. FIG. 12 is a cross-sectional view schematically showing structure of such semiconductor element. A basic structure of the semiconductor device shown in FIG. 12 is approximately the same as the semiconductor device 100 (FIG. 1) described in the first embodiment; however, the semiconductor device shown in FIG. 12 is different from the semiconductor device 100 in that the plurality of semiconductor elements 149 are formed into the multi-layered structure formed along the normal line of a face instead of the second semiconductor element 111.

In the semiconductor device shown in FIG. 12, a plurality of semiconductor elements 149 are formed into the multi-layered structure according to constitution by providing repeatedly the underfill resin 125, the semiconductor element 149, the underfill resin 125, the semiconductor element 149, . . . , the underfill resin 125, the semiconductor element 149 on a face of the insulating film 107 of the interconnect component 101. The conductive plug 151 penetrating the semiconductor element 149 is provided on the respective semiconductor elements 149. Further, the electrode 115 connecting adjacent two semiconductor elements 149 is provided on the respective underfill resins 125.

Furthermore, the plurality of semiconductor elements 149 are electrically connected with the interconnect component 101 according to repetition structure of the electrode 115 and the conductive plug 151 composed of the electrode 115 connecting to the insulating film 107, the conductive plug 151, the electrode 115, the conductive plug 151, . . . , the electrode 115. The repetition structure of the electrode 115 and the conductive plug 151 is formed in the direction of the normal line to a face of the interconnect component 101 on an approximate straight line. Therefore, the semiconductor device shown in FIG. 12, like the case of the semiconductor element shown in FIG. 11, has the structure excellent in connecting reliability in that connecting distance between the semiconductor elements 149 is short.

It should be noted that the structure in which the first semiconductor element 113 or the second semiconductor element 111 is composed of the multi-layered component of the plurality of semiconductor elements 149, is also capable of being applied to the structure of the interconnect component 101 described in the second embodiment and third embodiment.

Further, in the present embodiment and the semiconductor device of another embodiment having the multi-layered semiconductor elements 149, it is possible to employ a multi-layered memory module as the multi-layered semiconductor elements 149. Thereby, it is possible to obtain suitable electrical connection to the second semiconductor element 111 having a logic portion or the like, with increasing memory capacity.

(Fifth Embodiment)

Figure 13:
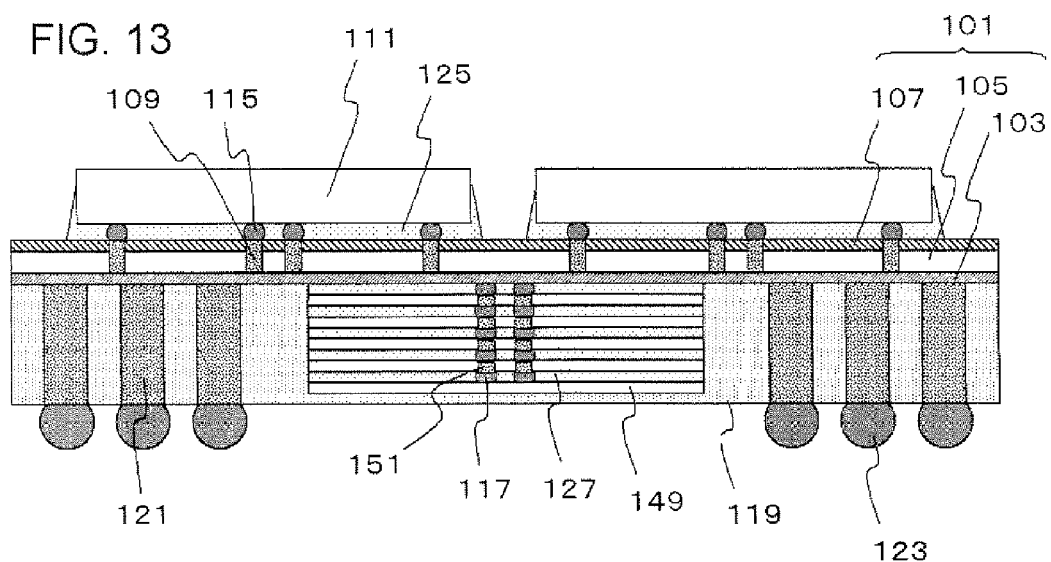
FIG. 13 is a cross-sectional view schematically showing the configuration of the semiconductor device according to the embodiment.

In the semiconductor devices described in the above embodiments, the plurality of semiconductor elements may have a planar arrangement on one face of the interconnect component 101. Hereinafter, there will be explained the case of the semiconductor device (FIG. 11) described in the fourth embodiment as an example. FIG. 13 is a cross-sectional view schematically showing structure of the semiconductor device according to the present embodiment.

A basic structure of the semiconductor device shown in FIG. 13 is approximately the same as the structure of the semiconductor device shown in FIG. 11 in that a plurality of multi-layered semiconductor elements 149 are connected with a side of a forming face of the insulating resin 119 of the interconnect component 101, that is, a face of a side of the interconnect layer 103, and an electrical connection is provided between the multi-layered semiconductor elements 149 through the conductive plug 151 penetrating the semiconductor element 149 and the electrode 117. Further, the semiconductor device shown in FIG. 13 is different from the semiconductor device shown in FIG. 11 in that a plurality of second semiconductor elements 111 are arranged on a face opposed to a forming face of the insulating resin 119 of the interconnect component 101, that is, a face of a side of the insulating film 107.

In the semiconductor device shown in FIG. 13, the semiconductor device has the structure where the plurality of second semiconductor elements 111 are arranged on the same plane, and the plurality of second semiconductor elements 111 connect to the interconnect layer 103 through the electrode 117 and the conductive via 109. For this reason, connecting distance between the plurality of second semiconductor elements 111 and the interconnect layer 103 is made linear, and it is possible to reduce the connecting distance thereof. Consequently, the semiconductor device shown in FIG. 13 has the structure excellent in connecting reliability between the plurality of second semiconductor elements 111 and the semiconductor elements 149. Moreover, it is possible to realize the conductive via 109 formed in the silicon layer 105 into high density, therefore, it is possible to surely connect the second semiconductor element 111 with the interconnect layer 103 with high density.

(Sixth Embodiment)

Figure 14:
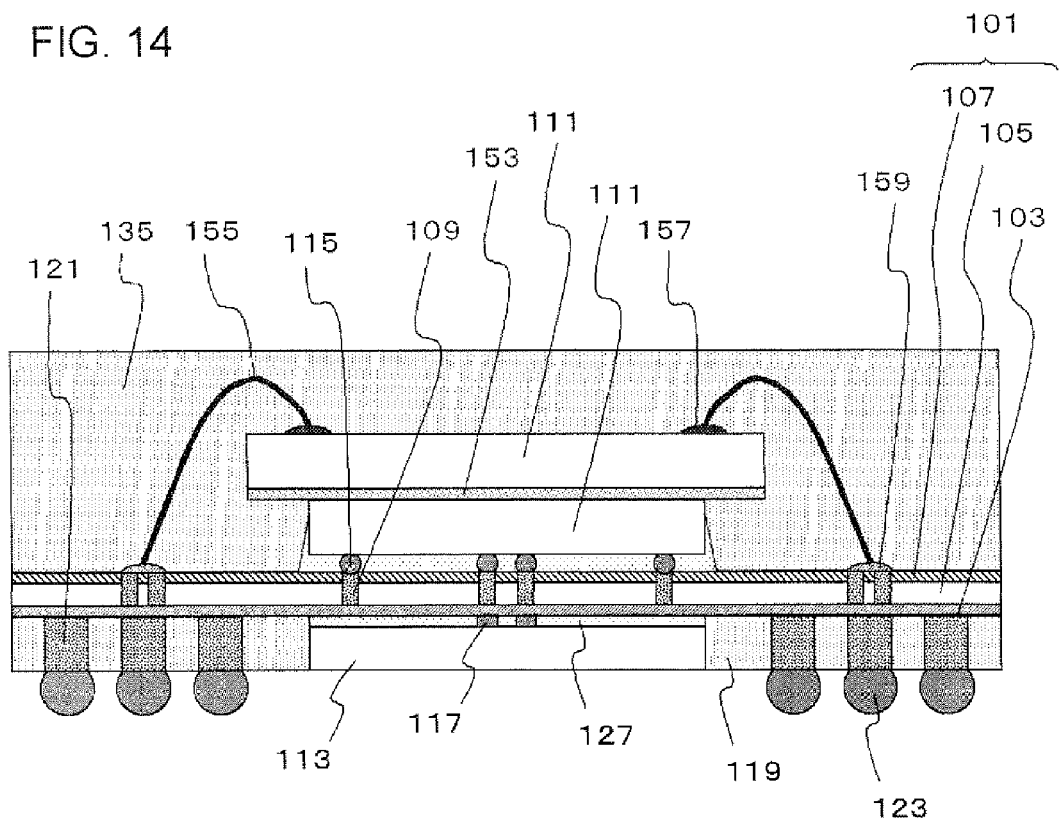
FIG. 14 is a cross-sectional view schematically showing the configuration of the semiconductor device according to the embodiment.

In the semiconductor devices described in the above embodiments, it is possible to also utilize the conductive via 109 provided inside the interconnect component 101 as a connecting component to a conductive wire. Further, the semiconductor device is capable of being realized with the structure wherein a plurality of semiconductor elements formed with the multi-layered structure on a face opposed to a forming face of the insulating resin 119 of the interconnect component 101 by an adhesive; and at least one semiconductor element thereof is electrically connected with the interconnect component 101 through the wire. FIG. 14 is a cross-sectional view schematically showing structure of the semiconductor device according to the present embodiment.

A basic structure of the semiconductor device shown in FIG. 14 is approximately the same as the semiconductor device (FIG. 6) described in the first embodiment, however the semiconductor device shown in FIG. 14 is different from the semiconductor device described in the first embodiment in that the conductive via 109 penetrating the silicon layer 105 of the interconnect component 101 and the insulating film 107 are also provided on a region where the first semiconductor element 113 and the second semiconductor element 111 are not provided.

Further, in the semiconductor device shown in FIG. 14, the plurality of multi-layered second semiconductor elements 111 with an adhesive 153 are connected with a face opposed to a forming face of the insulating resin 119 of the interconnect component 101, that is, a face of a side of the insulating film 107. The semiconductor device shown in FIG. 14 has the structure wherein at least one second semiconductor element 111 is connected with the conductive pad 159 formed by connecting to the conductive via 109 penetrating the silicon layer 105 and the insulating film 107 of the interconnect component through the wire 155 composed of the conductive pad 157 and a conductor. The conductive pad 157 is capable of being formed using, for instance, an electroless plating technique.

In the present embodiment, the conductive via 109 is also provided on a region sealed with the insulating resin 119 and the insulating resin 135 in addition to a bonding region of the first semiconductor element 113 and the second semiconductor element 111; thereby, this conductive via 109 is capable of being appropriately utilized for the wire bonding to the second semiconductor element 111. For this reason, the semiconductor device of the present embodiment has the structure wherein the degree of freedom in designing of electrical connection between the second semiconductor element 111 and the interconnect component 101 is large.

(Seventh Embodiment)

Figure 15A:
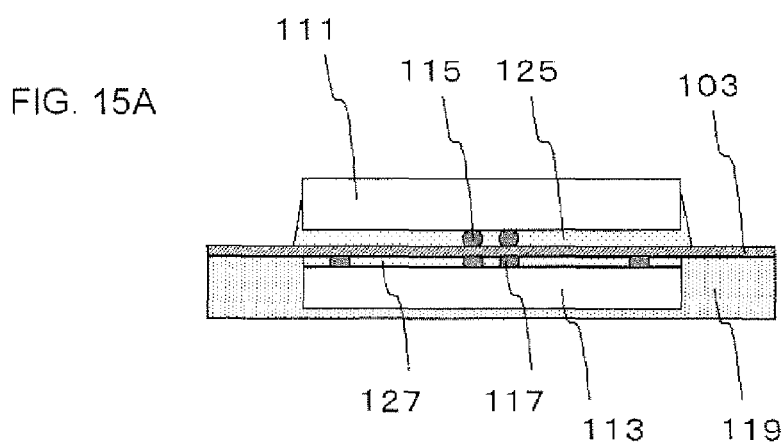
FIGS. 15A and 15B are cross-sectional views schematically showing the configuration of the semiconductor device according to the embodiment.
Figure 15B:
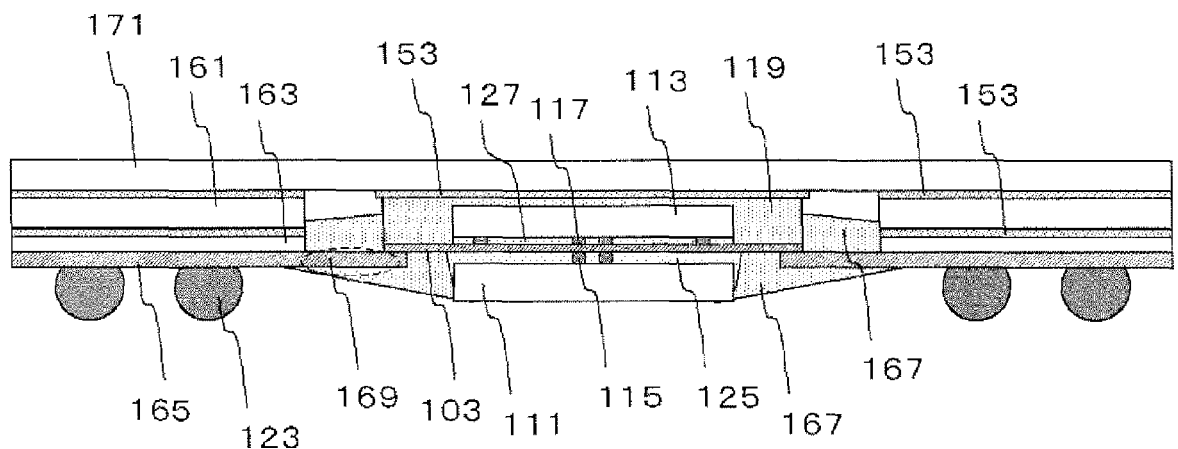

FIGS. 15A and 15B are cross-sectional views schematically showing structure of the semiconductor device according to the present embodiment. FIG. 15A is a view showing a state before bonding of the semiconductor device shown in FIG. 15B. The semiconductor device shown in FIG. 15A has the structure wherein the first semiconductor element 113 is bonded to one face of the interconnect component 101 composed of the interconnect layer 103 described in the third embodiment, and the second semiconductor element 111 is arranged on the other face thereof. The first semiconductor element 113 is embedded inside the insulating resin 119 covering above the interconnect component 101. It should be noted that the conductive plug 121 penetrating the insulating resin 119 and the electrode terminal 123 connecting to the conductive plug 121 are not provided in FIG. 15A.

The semiconductor device shown in FIG. 15A is a semiconductor module in which an electrical connection is performed between the chips. The semiconductor device shown in FIG. 15A, as shown in FIG. 15B, is bonded on a face of a heat spreader 171 with the adhesive 153. A support ring 161 and a TAB tape substrate 163 are sequentially bonded on a face of the heat spreader 171 in a side face of the semiconductor device. An interconnect layer 165 is provided on a face of the TAB tape substrate 163. The interconnect layer 165 has an inner lead wire 169 whose end portion is extended toward the interconnect layer 103, and the inner lead wire 169 is sealed with an inner lead wire sealing resin 167. And, the interconnect component 101 composed of the interconnect layer 103 extended out to an outside of the semiconductor device shown in FIG. 15A is connected with the interconnect layer 165 on the TAB tape substrate 163 through the inner lead wire 169 according to TAB (Tape Automated Bonding) technique.

Thus, the semiconductor device having the interconnect layer 103 is capable of being applied to a TAB connection type apparatus. It is possible to further enhance the degree of freedom in designing of the semiconductor device upon connecting the inner lead wire while using the TAB technique.

Figure 16:
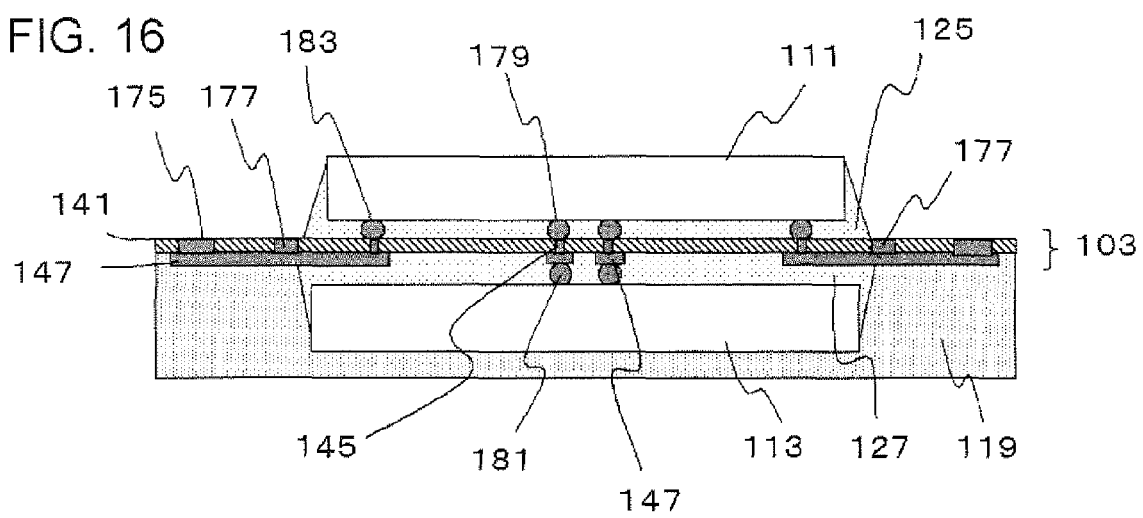
FIG. 16 is a cross-sectional view schematically showing the configuration of the semiconductor device according to the embodiment.

It should be noted that, in the semiconductor device according to the present embodiment, and another embodiment having the interconnect component 101 composed of the interconnect layer 103, the structure of the semiconductor module in which the first semiconductor element 113 and the second semiconductor element 111 are bonded to both faces of the interconnect component 101 can be made to be the following embodiment. FIG. 16 is a cross-sectional view schematically showing structure of the semiconductor module according to the present embodiment.

The semiconductor module shown in FIG. 16 is provided with the interconnect component 101 having basic structure approximately the same as the interconnect layer 103 shown in FIG. 32. A via plug 145 that is the connection electrode and an external lead-out pad 175 are provided in the same layer. Further, a resin stopping pattern 177 is provided with the same layer as the via plug 145 and the pad 175. The resin stopping pattern 177 is capable of being formed using the same material and the process as the via plug 145 and the pad 175.

The pad 175 is provided on the interconnect layer 103 in the side face of a forming region of the first semiconductor element 113 and the second semiconductor element 111. Further, the resin stopping pattern 177, in the vicinity of a forming region of the underfill resin 125 and the underfill resin 127, is provided in the side face of the forming region of the underfill resins.

Furthermore, the second semiconductor element 111 (logic LSI chip) connected with a face on opposite side to a forming face of the insulating resin 119 is connected with an interconnect 147 through an external input/output electrode 183, a via plug 145 and the interconnect 147. Moreover, the semiconductor element 111 is connected with the first semiconductor element 113 (memory LSI chip) in which an electrode for connecting to memory 179 is connected with a face on opposite side of the interconnect layer 103 through the via plug 145, the interconnect 147 and the memory electrode 181.

The semiconductor module shown in FIG. 16 is capable of being manufactured by using the method described in the third embodiment (FIGS. 9A to 9C, and FIGS. 10A to 10C). Further, it may be suitable to manufacture depending on the following process. FIGS. 21A to 21C, FIGS. 22A to 22C and FIG. 23 are cross-sectional views schematically showing another manufacturing process of the semiconductor module shown in FIG. 16.

Figure 21A:
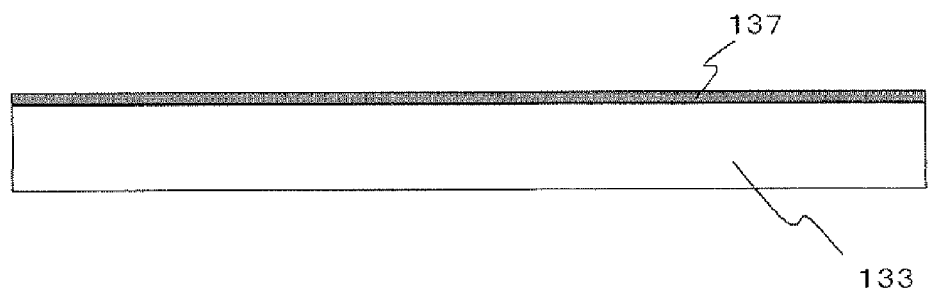
FIGS. 21A, 21B and 21C are cross-sectional process views schematically showing a manufacturing process of the semiconductor device according to the embodiment.
Figure 21B:
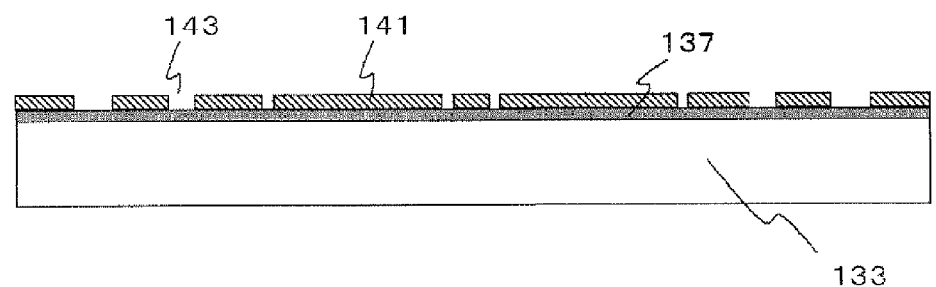

Firstly, a metal seed layer 137 is formed on a face of the silicon substrate 133 using sputtering technique or the like (FIG. 21A). The seed layer 137 is capable of being realized with, for instance, Cu layer or Ni layer or the like. Next, a laser via, that is, an opening 143 in such a way that an insulating resin film 141 is provided on the whole forming face of the seed layer 137 in the silicon substrate 133, followed by irradiating a laser beam to a predetermined position of the insulating resin film 141 is provided (FIG. 21B).

Figure 21C:
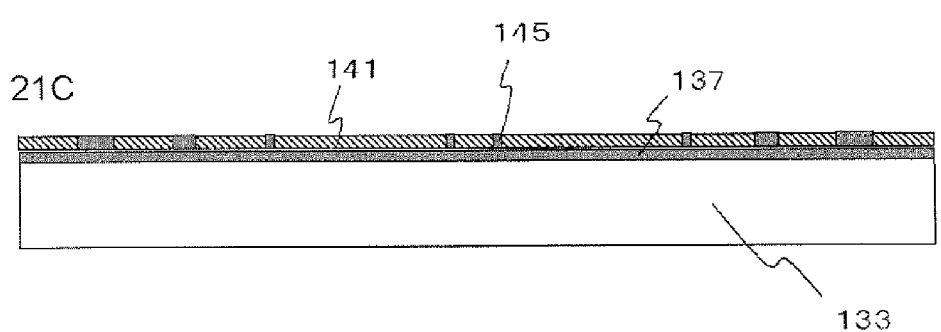

After that, the opening 143 is embedded with a predetermined metal film such as Cu or the like, to make the opening embedded with the predetermined metal film a connection electrode such as the via plug 145 or the like (FIG. 21C). It is possible to employ metals such as Cu, Ni, Au, or W or the like, or the conductive materials such as alloy or the like as the material of the connection electrode. Further specifically, it is possible to employ four-layered structure of Cu/Ni/Au/Ni from the upper layer as the connection electrode. Furthermore, also it is possible to employ three-layered structure of Cu/Ni/Au from the upper layer.

And then, the interconnect 147 having a predetermined pattern is formed on the insulating resin film 141 while connecting to the connection electrode (FIG. 22A). The material of the interconnect 147 is set to, for instance, metals such as Cu or the like. And then, a plating layer (not shown in the drawings) composed of Au/Ni from the upper layer is formed on a face of the interconnect 147. In accordance with the above process, the interconnect layer 103 is formed on the silicon substrate 133.

Next, the first semiconductor element 113 is connected with a face of the interconnect component 101 while using the manufacturing process of the semiconductor device 110 (FIG. 7) described in the second embodiment. The memory electrode 181 of the first semiconductor element 113 is connected to the interconnect 147 of the interconnect layer 103 to fill the underfill resin 127 between the first semiconductor element 113 and the interconnect layer 103 (FIG. 22B). And then, the insulating resin 119 is formed on the whole face of the interconnect layer 103 to cause the first semiconductor element 113 to be mold-encapsulated (FIG. 22C).

Figure 23:
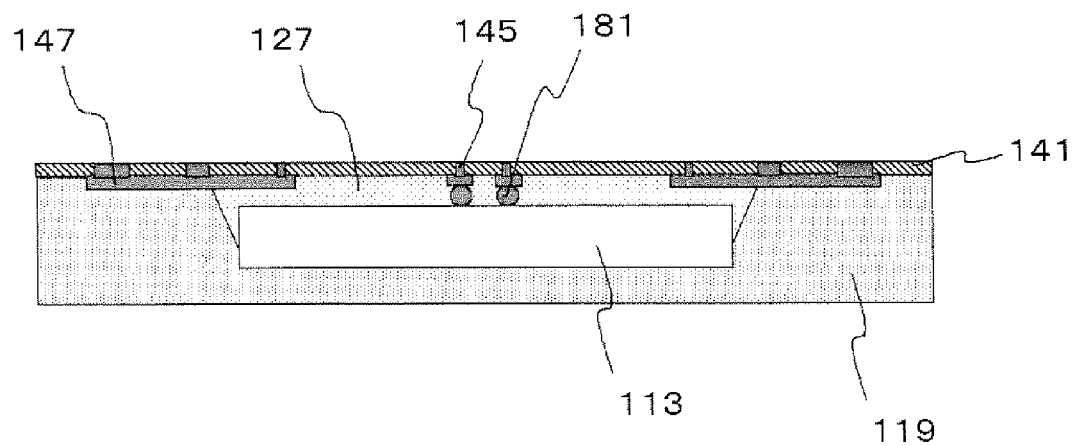
FIG. 23 is a cross-sectional process view schematically showing a manufacturing process of the semiconductor device according to the embodiment.

And then, the silicon substrate 133 is removed depending on a back side grinding or the like, followed by removing the seed layer 137 and the Ni layer using etching technique. Further, a face of the via plug 145 is exposed while grinding a portion of the insulating resin 119 (FIG. 23). And then, the second semiconductor element 111 is connected with a face of the interconnect component 101 while facing to the first semiconductor element 113. Thus, the semiconductor module shown in FIG. 16 can be obtained.

Figure 24:
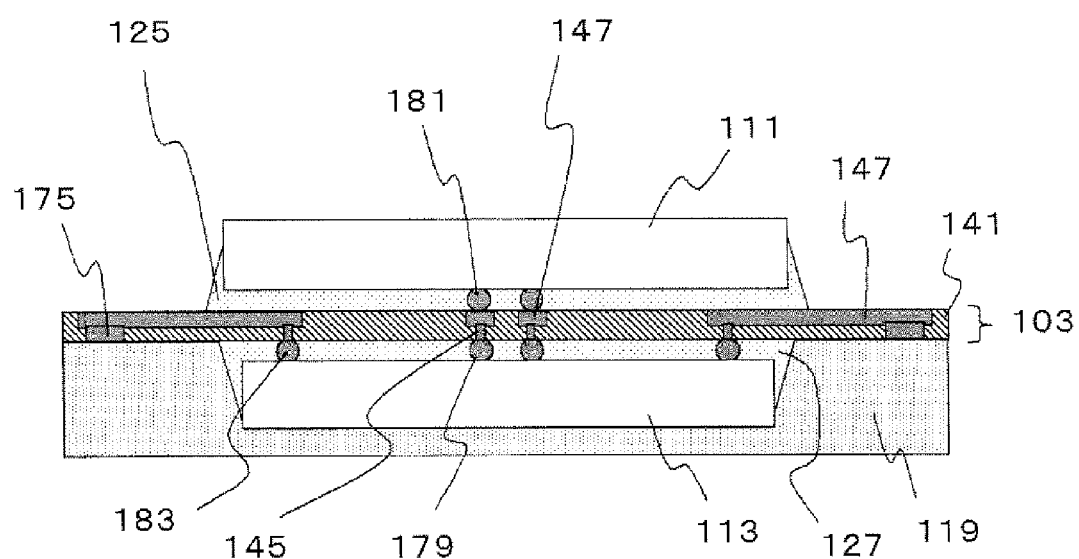
FIG. 24 is a cross-sectional view schematically showing the configuration of the semiconductor device according to the embodiment.

Moreover, FIG. 24 is a modified example of the semiconductor module shown in FIG. 16. A basic structure of the semiconductor module shown in FIG. 24 is approximately the same as that shown in FIG. 16, however the semiconductor module shown in FIG. 24 is different from that shown in FIG. 16 in that the bonded faces of the second semiconductor element 111 and the first semiconductor element 113 to the interconnect component 101 are reversed. In this structure, it is possible to employ, for instance, the first semiconductor element 113 as the logic LSI chip, and the second semiconductor element 111 as the memory chip.

Figure 25:
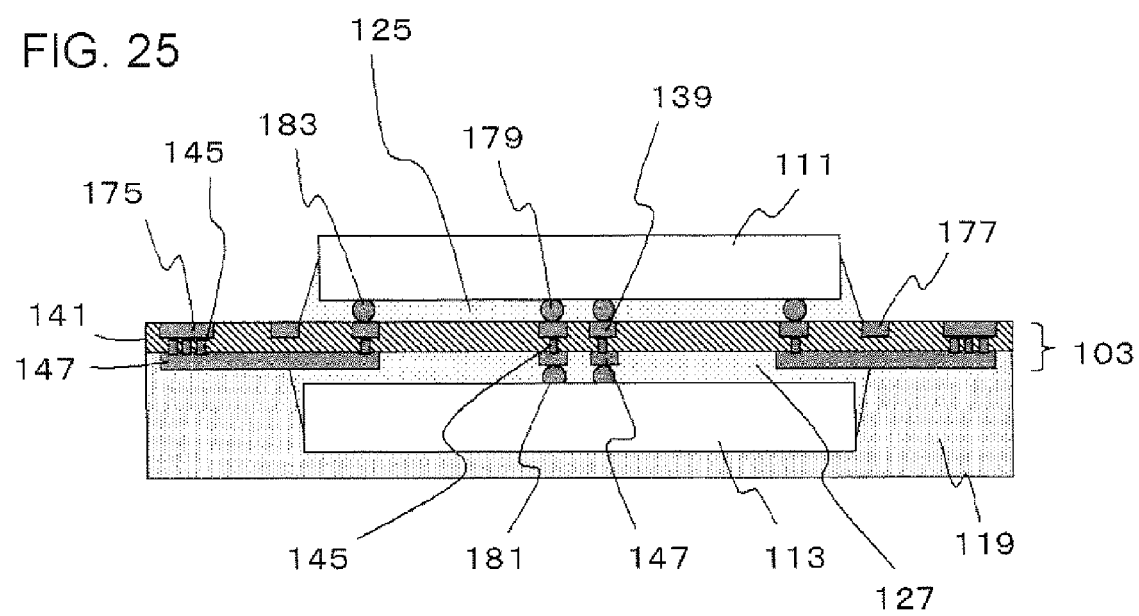
FIG. 25 is a cross-sectional view schematically showing the configuration of the semiconductor device according to the embodiment.
Figure 29:
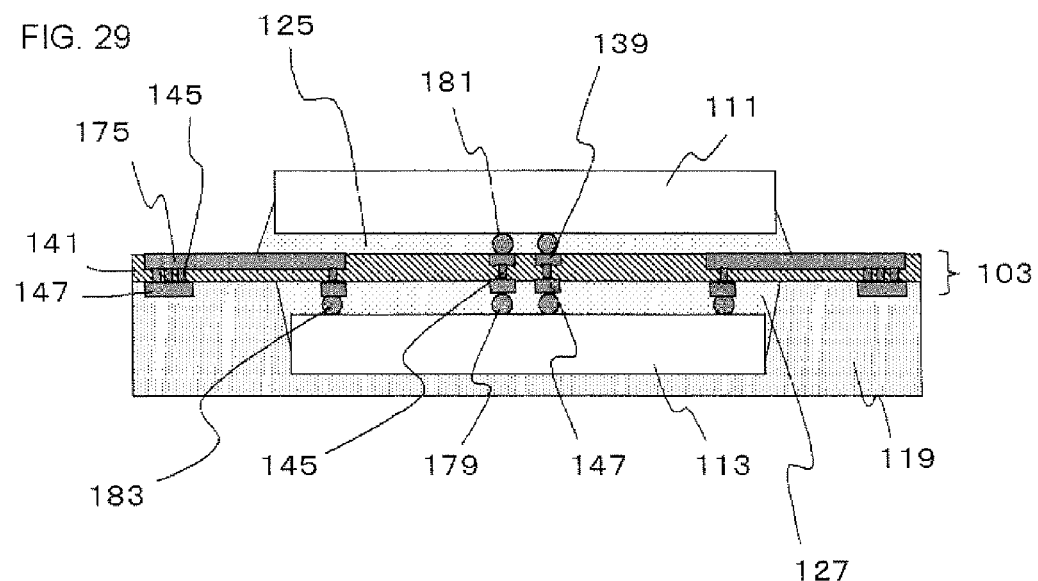
FIG. 29 is a cross-sectional view schematically showing the configuration of the semiconductor device according to the embodiment.

Further, in the present embodiment, the structure of the semiconductor module having the interconnect component 101 composed of the interconnect layer 103 may be the structure shown in FIG. 25 or FIG. 29. FIG. 25 and FIG. 29 are cross-sectional views schematically showing structure of the semiconductor module according to the present embodiment. A basic structure of the semiconductor modules shown in FIG. 25 and FIG. 29 is approximately the same as the semiconductor modules shown in FIG. 16 and FIG. 24, however, the semiconductor modules shown in FIG. 25 and FIG. 29 are different from the semiconductor modules shown in FIG. 16 and FIG. 24 in that the interconnect layer 103 is formed into three-layered structure composed of a forming layer of the connection electrode 139, a forming layer of the via plug 145 and a forming layer of the interconnect 147. A part of the connection electrode 139 is the element connection electrode, and another part thereof is the pad 175 that is the external connection electrode.

Further, in the structure shown in FIG. 25, for instance, it is possible to employ the first semiconductor element 113 as the memory chip, and the second semiconductor element 111 as the logic LSI chip. Furthermore, a basic structure of the semiconductor module shown in FIG. 29 is approximately the same structure as FIG. 25; however, the semiconductor module shown in FIG. 29 is different from that shown in FIG. 25 in that the bonded faces of the second semiconductor element 111 and the first semiconductor element 113 to the interconnect component 101 are reversed. In this structure, it is possible to employ, for instance, the first semiconductor element 113 as the logic LSI chip, and the second semiconductor element 111 as the memory chip.

The semiconductor module shown in FIG. 25 is manufactured, for instance, in such a way as a following process. FIGS. 26A to 26C, FIGS. 27A to 27C and FIGS. 28A to 28B are cross-sectional views schematically showing manufacturing process of the semiconductor module shown in FIG. 25.

Figure 26A:
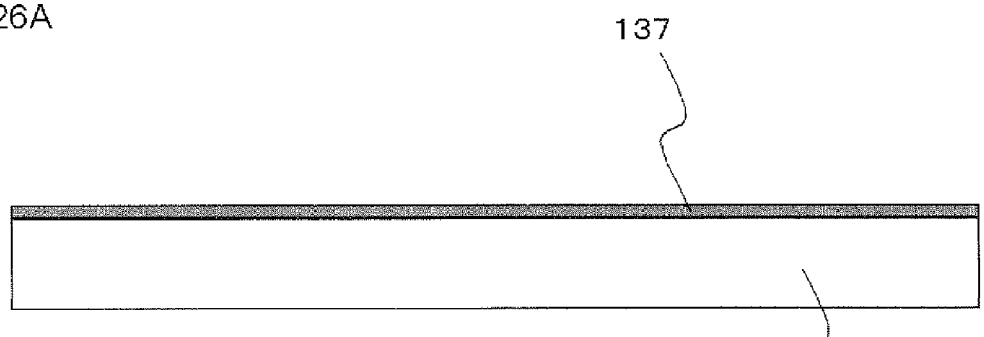
FIGS. 26A, 26B and 26C are cross-sectional process views schematically showing a manufacturing process of the semiconductor device according to the embodiment.
Figure 26B:
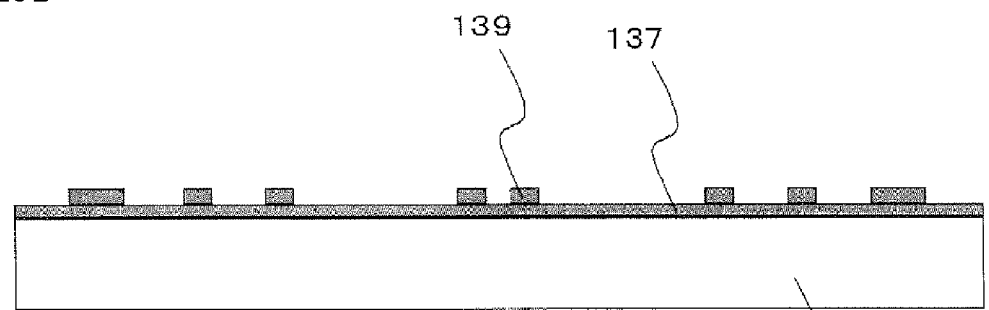

Firstly, a metal seed layer 137 is formed on a face of the silicon substrate 133 while using the sputtering technique or the like (FIG. 26A). Next, a resist pattern to expose an interconnect forming position is formed on the seed layer 137, and a connection electrode 139 of a predetermined pattern is formed with the exposed portion of the seed layer 137 as a starting point (FIG. 26B).

Figure 26C:
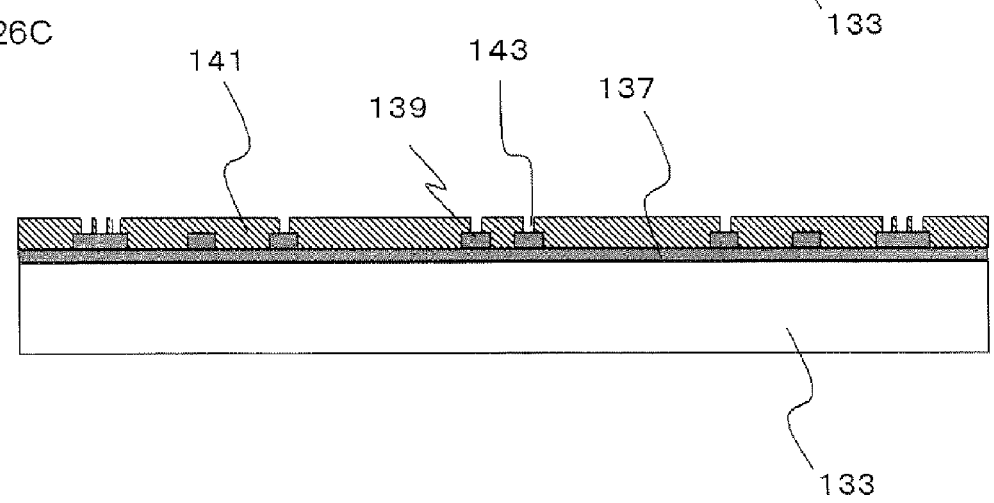

Next, the insulating resin film 141 is provided on the whole forming face of the connection electrode 139 to embed the connection electrode 139 with the insulating resin (FIG. 26C). The insulating resin film 141 is capable of being formed using, for instance, a method for bonding an insulating resin sheet of laminated film shape, or spin coat technique or the like. The insulating resin film 141 is provided on the whole forming face of the seed layer 137 in the silicon substrate 133, and the laser via, that is, the opening 143 is provided while irradiating the laser light on the predetermined position of the insulating resin film 141 (FIG. 26C).

Figure 27A:
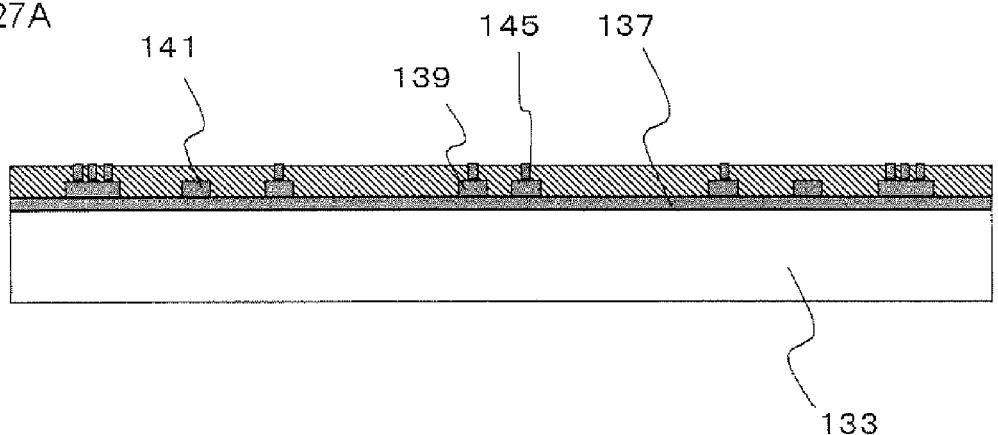
FIGS. 27A, 27B and 27C are cross-sectional process views schematically showing a manufacturing process of the semiconductor device according to the embodiment.

After that, the opening 143 is embedded with the predetermined metal film such as Cu or the like to make it a via plug 145 (FIG. 27A). It is possible to employ, for instance, the metal such as Cu or the like, as the material of the via plug 145. Further, the via plug 145 is capable of being formed using, for instance, the plating technique.

Figure 27B:
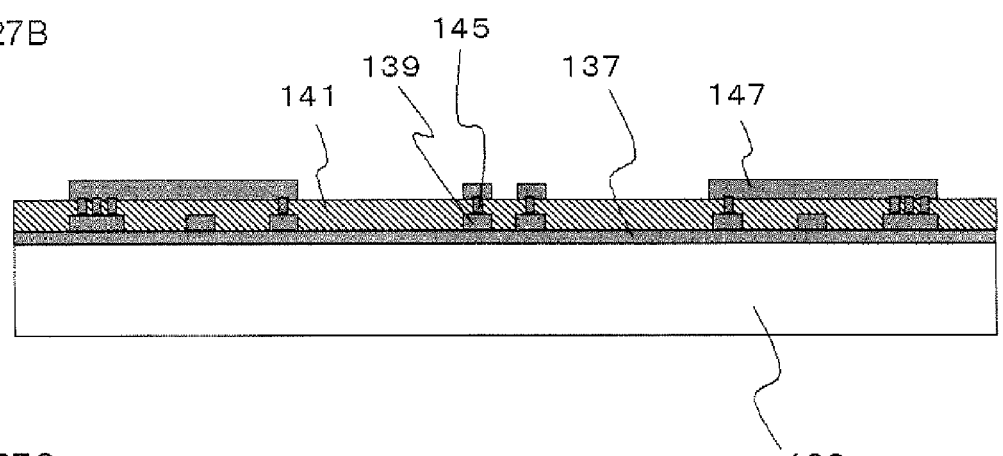

And then, the interconnect 147 having a predetermined pattern is formed on the insulating resin film 141 while connecting with the via plug 145 (FIG. 27B). The material of the interconnect 147 is set to, for instance, the metal such as Cu or the like. And then, a plating layer (not shown in the drawings) composed of Au/Ni is formed from the upper layer on a face of the interconnect 147. The interconnect layer 103 is formed on the silicon substrate 133 using the above process.

Figure 27C:
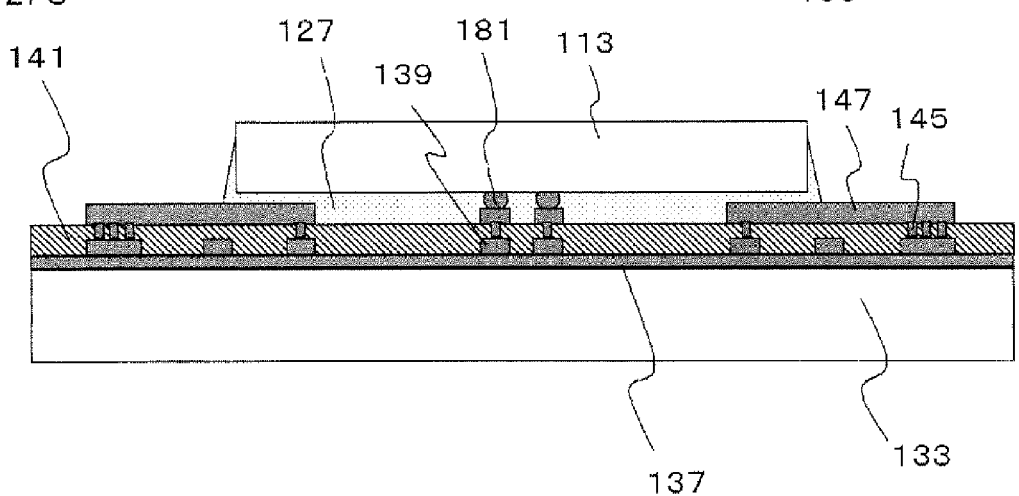
Figure 28A:
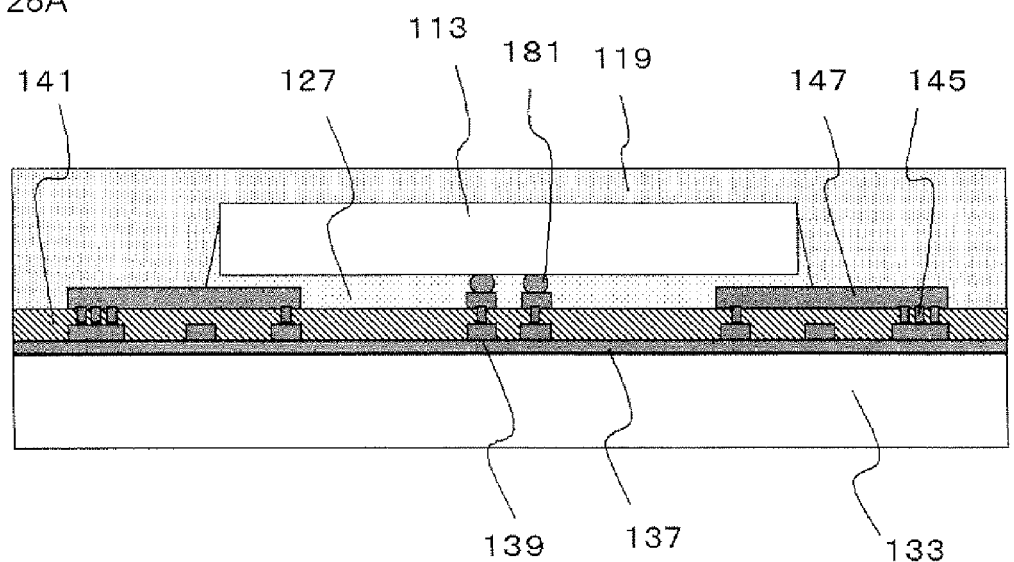
FIGS. 28A and 28B are cross-sectional process views schematically showing a manufacturing process of the semiconductor device according to the embodiment.
Figure 28B:
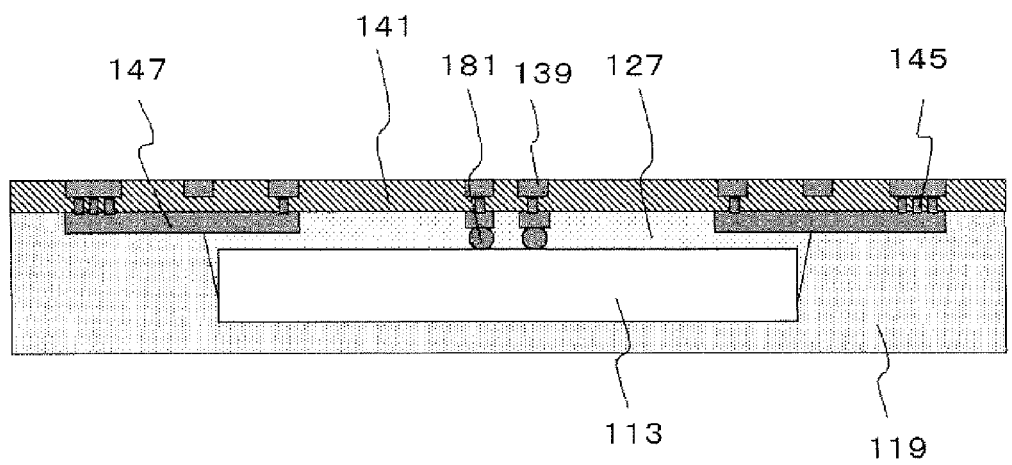

Next, the first semiconductor element 113 is connected with a face of the interconnect component 101 while using the manufacturing process of the semiconductor device 110 (FIG. 7) described in the second embodiment. The memory electrode 181 of the first semiconductor element 113 is connected to the interconnect 147 of the interconnect layer 103; and the underfill resin 127 is filled between the first semiconductor element 113 and the interconnect layer 103 (FIG. 27C). And then, the insulating resin 119 is formed on the whole face of the interconnect layer 103; and the first semiconductor element 113 is mold-encapsulated (FIG. 28A). And then, the silicon substrate 133 is removed using the back side grinding or the like, and the seed layer 137 and the Ni layer are removed using etching technique to expose a face of the via plug 145 (FIG. 28B). And then, the second semiconductor element 111 is connected with a face of the interconnect component 101 while facing to the first semiconductor element 113. Thus, the semiconductor module shown in FIG. 25 can be obtained.

It should be noted that such a semiconductor module is capable of being applied to not only the semiconductor device having the interconnect component 101 composed of the interconnect layer 103, but also the semiconductor device (FIG. 14) or the like described in, for instance, sixth embodiment.

(Eighth Embodiment)

Figure 17A:
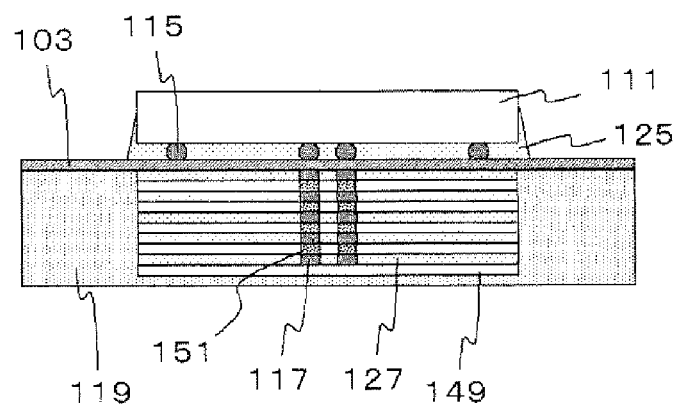
FIGS. 17A and 17B are cross-sectional views schematically showing the configuration of the semiconductor device according to the embodiment.
Figure 17B:
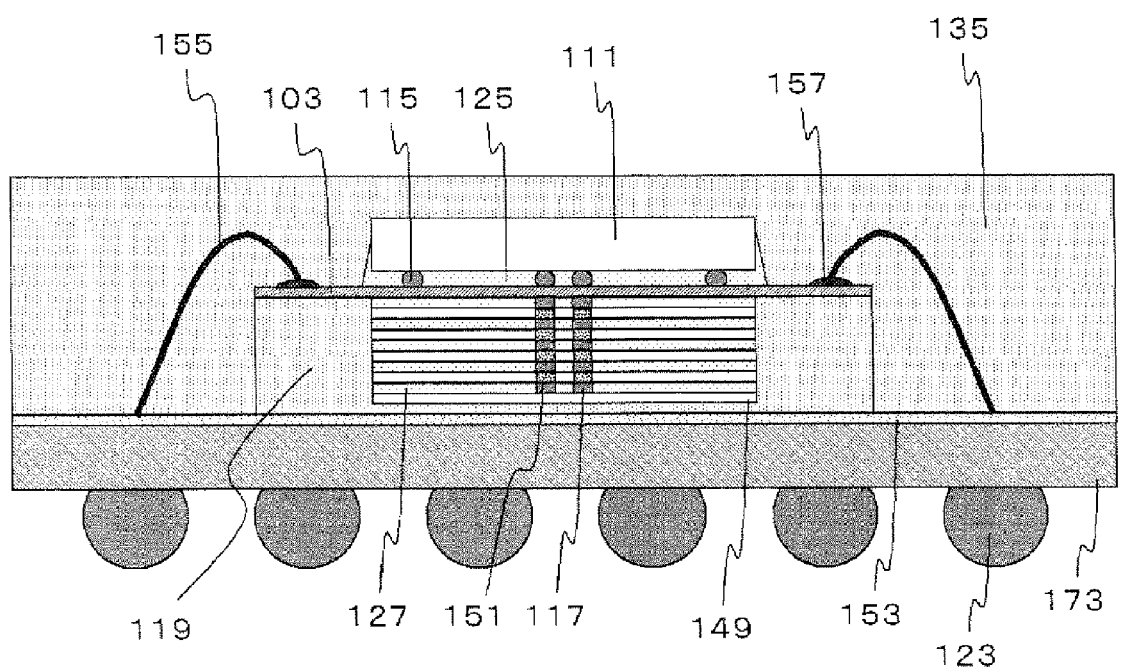

FIGS. 17A and 17B are cross-sectional views schematically showing structure of the semiconductor device according to the present embodiment. The semiconductor device shown in FIG. 17A has a flat plate shaped interconnect component composed of the interconnect layer 103, the first semiconductor element 113 provided on a face on one side of the interconnect layer 103, the insulating resin 119 coating the face on one side and a side face of the first semiconductor element 113, the conductive plug 121 extending through (penetrating) the insulating resin 119, and the second semiconductor element 111 provided on a face on the other side of the interconnect layer 103.

The first semiconductor element is a multi-layered component in which a plurality of semiconductor elements 149 are formed into the multi-layered structure along the perpendicular direction to a face, has the structure wherein the electrode 117 provided on a side, which is the most far from the interconnect component 101 in the interconnect 147, is the same as the electrode 115 provided on a face of a side of the interconnect layer 103 of the first semiconductor element 113 in a plan view.

It should be noted that, in the present embodiment, the interconnect layer 103 has the flat plate shaped insulating resin film 141 (not shown in FIG. 17A), and the conductive component penetrating the insulating component; and the interconnect layer 103 electrically connects the plurality of semiconductor elements 149 with the second semiconductor element 111 through the conductive component.

The semiconductor module shown in FIG. 17A, as shown in FIG. 17B, is connected with an interconnect substrate 173 by the conductive pad 157 connecting with the interconnect and a wire 155 connecting with the conductive pad 157 in the interconnect layer 103; and the semiconductor module and the wire 155 are sealed with an insulating resin 135.

Next, there will be explained a method for manufacturing the semiconductor module shown in FIG. 17A. FIGS. 18A to 18C and FIGS. 19A to 19B are cross-sectional views explaining the manufacturing process of the semiconductor device shown in FIGS. 17A and 17B.

Figure 18A:
FIGS. 18A, 18B and 18C are cross-sectional process views schematically showing a manufacturing process of the semiconductor device according to the embodiment.
Figure 18B:
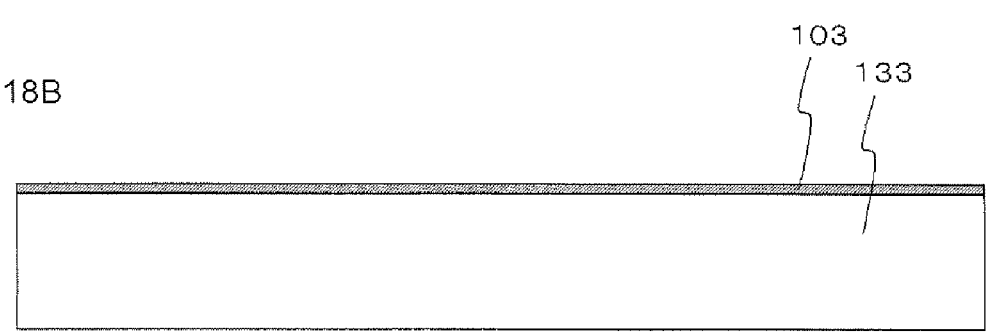
Figure 18C:
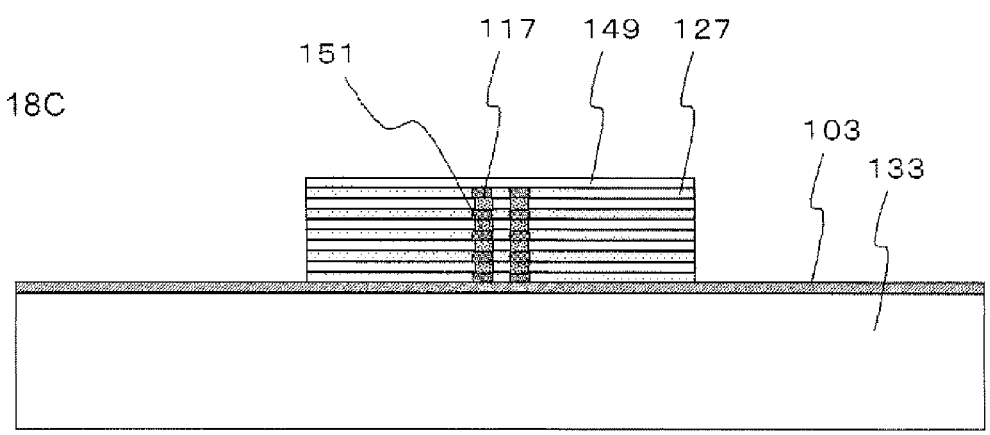

Firstly, the interconnect layer 103 is formed on the silicon substrate 133 shown in FIG. 18A (FIG. 18B). It is possible to employ the method described in, for instance, the third embodiment or the seventh embodiment as a method for forming the interconnect layer 103. Next, the semiconductor element 149 formed the electrode 117 on one face in advance is bonded to the interconnect on the interconnect layer 103. And then, the underfill resin 127 is filled between the semiconductor element 149 and the electrode 117. By repeating this process, a predetermined number of semiconductor elements 149 are formed on the interconnect layer 103 with the multi-layered structure (FIG. 18C).

Figure 19A:
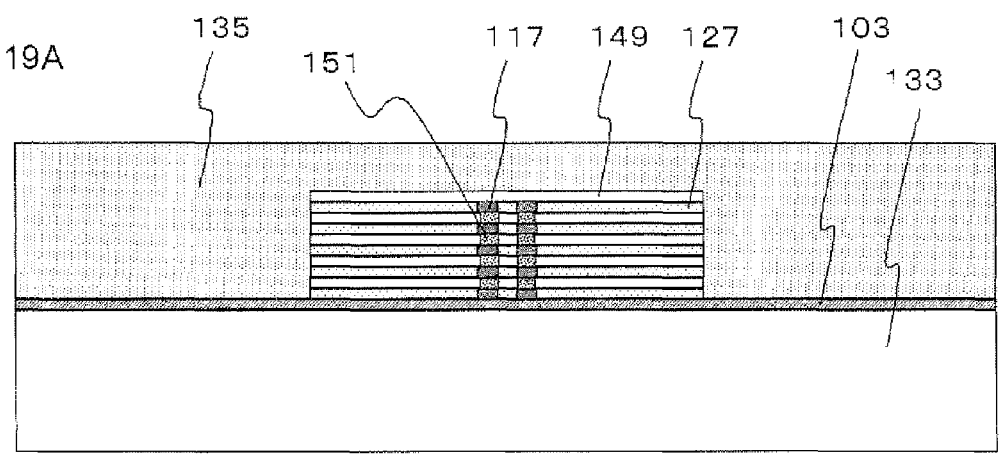
FIGS. 19A and 19B are cross-sectional process views schematically showing a manufacturing process of the semiconductor device according to the embodiment.
Figure 19B:
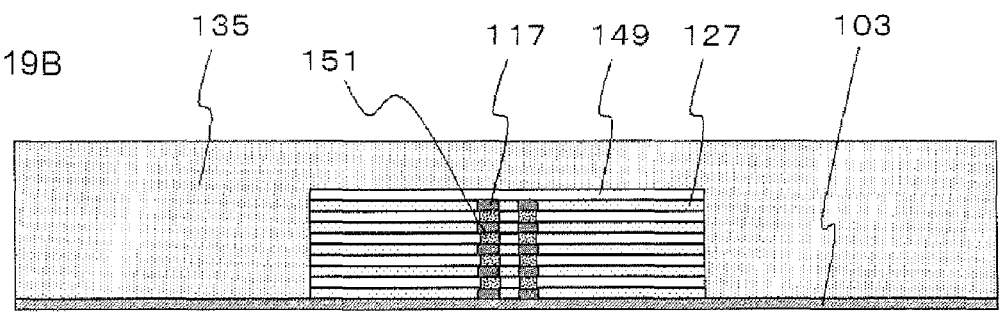

Next, a face of a side where the semiconductor element 149 of the interconnect layer 103 is formed into the multi-layered structure is coated with the insulating resin 135. At this time, the semiconductor element 149 is embedded inside the insulating resin 135 (FIG. 19A). And then, the silicon substrate 133 is removed from a back side face using the method of a back side grinding technique or the like (FIG. 19B). And then, the second semiconductor element 111 is bonded to a face of the interconnect layer 103 exposed due to removing of the silicon substrate 133. Thereby, the semiconductor module shown in FIG. 17A can be obtained.

The semiconductor device shown in FIG. 17B is capable of being obtained in such a way that the semiconductor module obtained from the above process is bonded to a face of the interconnect substrate 173, followed by performing bonding by the wire 155 and sealing by the insulating resin 135, and forming the electrode terminal 123 is performed.

The semiconductor device shown in FIGS. 17A and 17B has the structure wherein the second semiconductor element 111 and the semiconductor element 149 have the conductive component, which is provided in a straight line and in the normal direction of the main face of the interconnect component 101; and the second semiconductor element 111 is connected with the semiconductor element 149. For this reason, it is possible to arrange the conductive component with high density while shortening connecting distance between the second semiconductor element 111 and the semiconductor element 149. Consequently, it is possible to enhance signal processing speed between the second semiconductor element 111 and the semiconductor element 149.

Figure 20A:
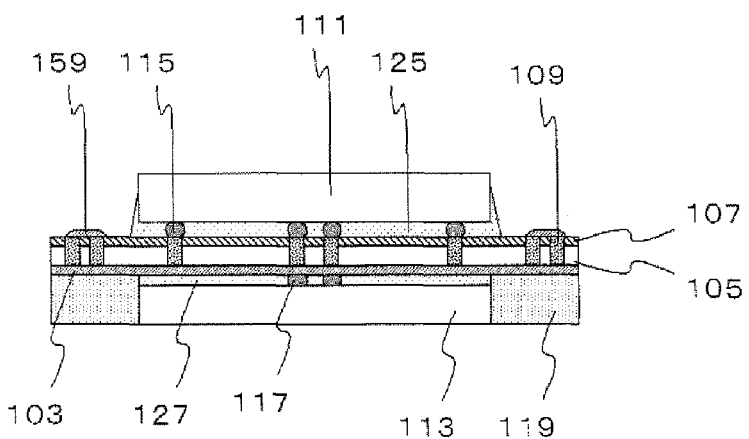
FIGS. 20A and 20B are cross-sectional views schematically showing the configuration of the semiconductor device according to the embodiment.
Figure 20B:
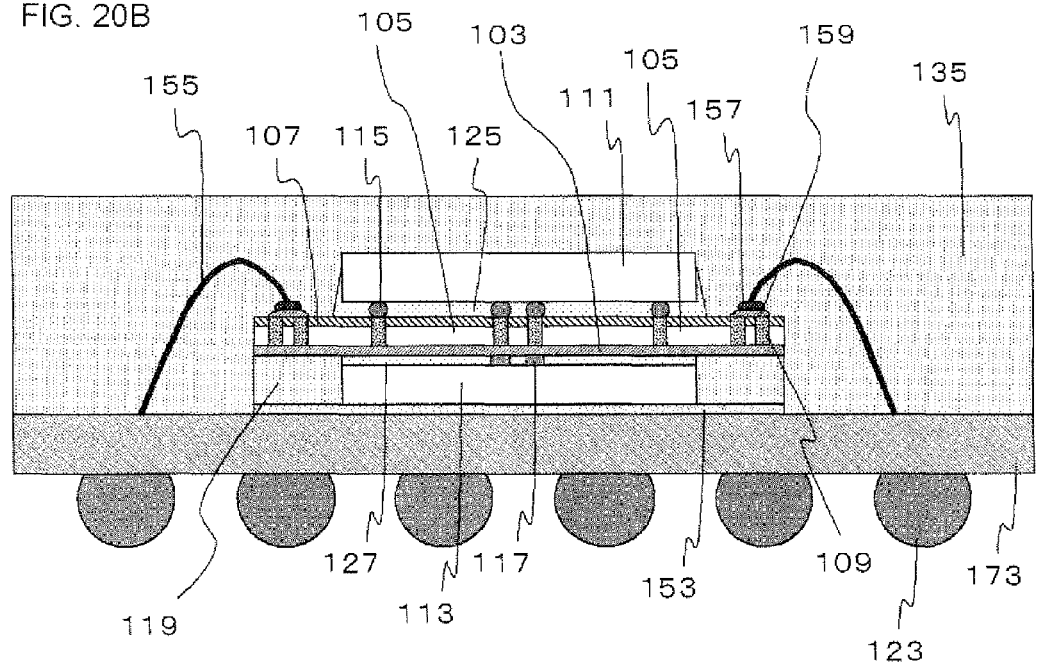

Further, FIGS. 20A and 20B, in the semiconductor device shown in FIGS. 17A and 17B respectively, are cross-sectional views schematically showing the semiconductor device having the structure wherein the interconnect component 101 is a multi-layered component composed of the insulating film 107, the silicon layer 105 and the interconnect layer 103, and one of the first semiconductor element 113 is connected to one face of the interconnect layer 103, instead of the multi-layered component of the semiconductor element 149.

As shown in FIG. 20B, the semiconductor device has the semiconductor module (FIG. 20A) having the conductive pad 157 formed by connecting with the silicon layer 105 and the conductive via 109 penetrating the insulating film 107 on the interconnect substrate 173 through the adhesive 153. The semiconductor device has the structure wherein the conductive pad 157 is electrically connected with the interconnect substrate 173 using the wire 155, and the semiconductor module and the wire 155 are sealed with the insulating resin 135.

Figure 30:
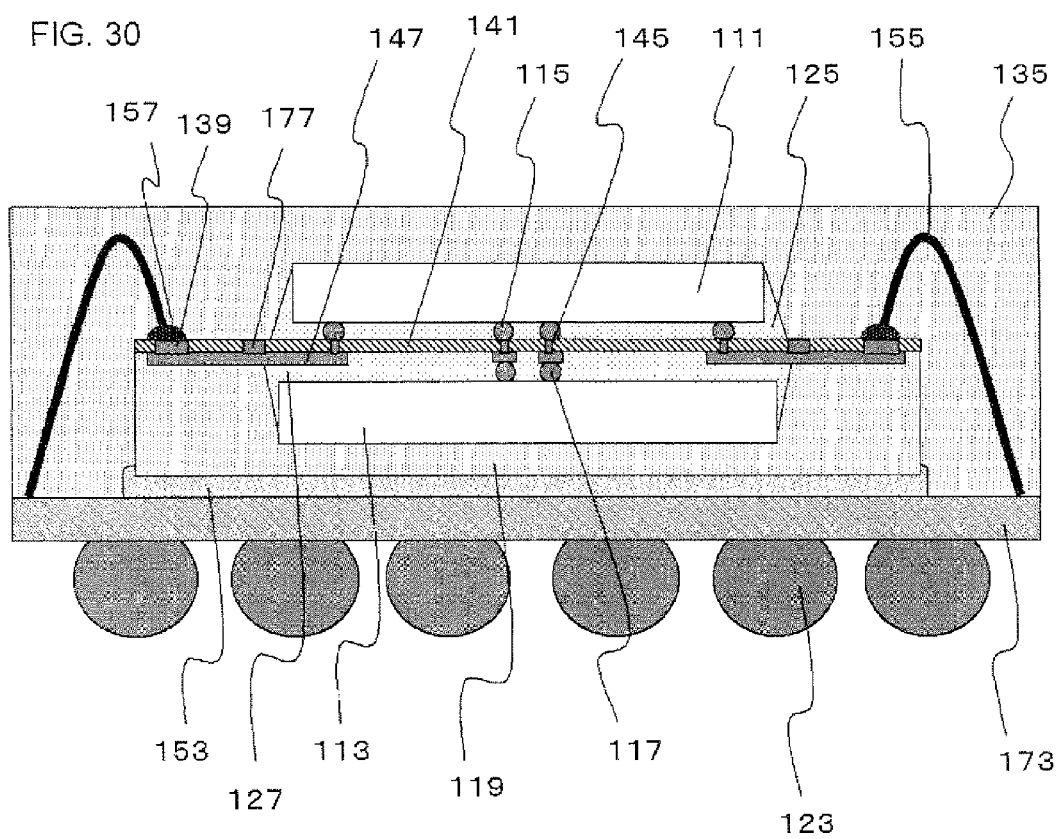
FIG. 30 is a cross-sectional view schematically showing the configuration of the semiconductor device according to the embodiment.

Further, FIG. 30 is a cross-sectional view showing an example in which the semiconductor module having the interconnect component 101 composed of the interconnect layer 103 is applied to the semiconductor device shown in FIG. 20B. It should be noted that, in FIG. 30, the semiconductor device has the structure wherein the first semiconductor element 113 is embedded with the insulating resin 119 not exposed from the insulating resin 119.

In the semiconductor device shown in FIG. 30, the first semiconductor element 113 and the second semiconductor element 111 are electrically connected with the interconnect substrate 173 through the interconnect layer 103, upon connecting the connection electrode 139 to the conductive pad 157 and connecting the conductive pad 157 with the interconnect substrate 173 by the wire 155. In this structure, it is possible to employ, for instance, Ag pasted material as the adhesive 153 connecting the insulating resin 119 with the interconnect substrate 173. It should be noted that, in FIG. 30, a part of the connection electrode 139 is the via plug 145.

In the semiconductor device shown in FIG. 30, the second semiconductor element 111 is connected with the first semiconductor element 113 with short distance and high density while connecting the interconnect component 101 with the interconnect substrate 173 surely, resulting in the structure excellent in operation characteristics.

In the description as above, there has been described the embodiment of the present invention with reference to the drawings, however, these are the exemplifications of the present invention, consequently, it is also possible to employ various constitution in addition to the above description.

For instance, in the semiconductor device described in the above embodiments, it is possible to use the structure of the interconnect component 101 described in any one of the first embodiment to the third embodiment while selecting appropriately.

It is apparent that the present invention is not limited to the above embodiment, that modified and changed without departing from the scope and sprit of the invention.

The invention claimed is:

1. A method for manufacturing a semiconductor device, comprising:
   forming an interconnect component having an insulating film, a plurality of electrodes including a first electrode group and a second electrode group, and a plurality of interconnects connecting between said first electrode group and said second electrode group, the interconnect component formed over a substrate;
   forming a first semiconductor element on a first surface of said interconnect component, which is opposite to a surface having said substrate;
   removing said substrate from said interconnect component to expose said first electrode group and said second electrode group on a face of said interconnect component;
   connecting said first electrode group to an electrode group of a second semiconductor element respectively; and
   forming an electrode terminal connected to said second electrode group that is exposed,
   wherein an end of said electrode terminal is formed so as to protrude out further from said interconnect component than said second semiconductor element, and
   wherein the thickness of said first semiconductor element is thicker than the thickness of said interconnect component.

2. The method for manufacturing the semiconductor device according to claim 1,
   wherein said forming said interconnect component includes forming an insulating film having a plurality of via plugs as said first electrode group over said substrate.

3. The method for manufacturing the semiconductor device according to claim 2, wherein said forming said insulating film includes forming said insulating film provided a plurality of openings on said substrate; and forming a conductive component so as to fill in said openings.

4. The method for manufacturing the semiconductor device according to claim 1,
   wherein said forming said interconnect component includes forming said first electrode and said second electrode over said substrate; forming said insulating film having a plurality of conductive components provided on each electrode of said first electrode group and said second electrode group in a smaller cross-sectional width than a cross-sectional width of said first electrode and said second electrode; and forming said plurality of interconnects on said insulating film.

5. The method for manufacturing the semiconductor device according to claim 4,
   wherein said forming said insulating film having said plurality of conductive components includes forming said insulating film provided an opening at a position corresponding to each electrode of said first electrode group and said second electrode group, which is formed over said substrate; and forming an conductive component so as to fill in said opening.

6. The method for manufacturing the semiconductor device according to claim 1, wherein said forming said interconnect component includes forming a seed layer on a face of said substrate; and forming said interconnect component on said seed layer.

7. The method for manufacturing the semiconductor device according to claim 6, wherein removing said substrate from said interconnect component to expose said first electrode group and said second electrode group on a face of said interconnect component includes removing said seed layer from said interconnect component after removing said substrate from said interconnect component.

8. The method for manufacturing the semiconductor device according to claim 1, wherein said first semiconductor element is provided before removing said substrate from said interconnect component.

9. The method for manufacturing the semiconductor device according to claim 8, wherein said interconnect component includes a plurality of through electrodes, and said first semiconductor element and said second semiconductor element are connected through said through electrode.

10. The method for manufacturing the semiconductor device according to claim 8, comprising covering a face of a side of said second semiconductor element with a sealing resin.

11. The method for manufacturing the semiconductor device according to claim 1,
wherein said first electrode group and said second electrode group are embedded in said insulating film.

12. The method for manufacturing the semiconductor device according to claim 1,
wherein said plurality of interconnects are formed on the face of said interconnect component on opposite side to a side of having said first semiconductor element.

13. The method for manufacturing the semiconductor device according to claim 1, wherein said first electrode group is electrically and directly connected to said second electrode group through said interconnects so that i) the electrode terminal connected to said second electrode group is physically contacting with said second electrode group, and ii) the plurality of interconnects connecting between said first electrode group and said second electrode group physically contact with one of the first and second electrode groups.

14. The method for manufacturing the semiconductor device according to claim 1, wherein said first electrode group is formed on a position of overlapping with said first semiconductor element in a plan view.

15. The method for manufacturing the semiconductor device according to claim 1, wherein said first semiconductor element is employed as a memory chip, and said second semiconductor element is employed as a logic chip.

16. The method for manufacturing the semiconductor device according to claim 1, wherein,
said plurality of interconnects include a plate-shaped interconnect,
one edge of said plate-shaped interconnect connects to said second semiconductor element, and
another edge of said plate-shaped interconnect connects to said electrode terminal.

17. The method for manufacturing the semiconductor device according to claim 1, wherein, in sectional view, the width of said first semiconductor element is wider than the width of said second semiconductor element.

18. The method for manufacturing the semiconductor device according to claim 1, wherein an end of said electrode terminal is formed so as to protrude out further from said interconnect component than said second semiconductor element by more than the thickness amount of said second semiconductor element.

19. The method for manufacturing the semiconductor device according to claim 1, wherein the thickness of said first semiconductor element is thicker that the thickness of said second semiconductor element.

* * * * *